(12) United States Patent
Shim et al.

(10) Patent No.: US 10,982,061 B2
(45) Date of Patent: Apr. 20, 2021

(54) PHOTOSENSITIVE RESIN COMPOSITION AND DISPLAY DEVICE INCLUDING THE SAME

(71) Applicant: Samsung Display Co., Ltd., Yongin-si (KR)

(72) Inventors: Seung Bo Shim, Asan-si (KR); Chang Hun Kwak, Suwon-si (KR); Hye Won Jang, Asan-si (KR); Byung Uk Kim, Hwaseong-si (KR); Tai Hoon Yeo, Hwaseong-si (KR); Hyoc Min Youn, Hwaseong-si (KR); Sang-Hoon Lee, Hwaseong-si (KR); Tae Pyo Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 19 days.

(21) Appl. No.: 16/586,217

(22) Filed: Sep. 27, 2019

(65) Prior Publication Data
US 2020/0102433 A1   Apr. 2, 2020

(30) Foreign Application Priority Data
Sep. 28, 2018   (KR) .................. 10-2018-0116423

(51) Int. Cl.
*H01L 51/00*   (2006.01)
*C08J 5/18*   (2006.01)
(Continued)

(52) U.S. Cl.
CPC ............... *C08J 5/18* (2013.01); *C08F 220/28* (2013.01); *C08F 220/32* (2013.01); *C08J 3/24* (2013.01);
(Continued)

(58) Field of Classification Search
CPC ............ H01L 27/1248; H01L 27/1259; H01L 51/0036; H01L 51/0043; H01L 51/5262;
(Continued)

(56) References Cited

U.S. PATENT DOCUMENTS 6,524,764 B1 * 2/2003 Tomikawa ............. C08G 73/10
430/191
6,686,120 B2 * 2/2004 Lee ........................ G03F 7/0233
430/165
(Continued)

FOREIGN PATENT DOCUMENTS

KR   10-1059137 B1   8/2011
KR   10-1099336 B1   12/2011
(Continued)

*Primary Examiner* — Stephen W Smoot
(74) *Attorney, Agent, or Firm* — Lewis Roca Rothgerber Christie LLP

(57) ABSTRACT

A photosensitive resin composition includes: a) an acryl-based copolymer obtained by copolymerizing i) a hydroxyl group-containing unsaturated compound; ii) an unsaturated carboxylic acid, an unsaturated carboxylic anhydride, or a mixture thereof; iii) an epoxy group-containing unsaturated compound; and iv) an olefin-based unsaturated compound, b) a 1,2-quinonediazide 5-sulfonic ester compound having a phenol compound including a compound represented by the above Chemical Formula A as ballast, c) a silane coupling agent, and d) a solvent.

20 Claims, 1 Drawing Sheet

(51) Int. Cl.
  *C08F 220/28* (2006.01)
  *C08F 220/32* (2006.01)
  *C08J 3/24* (2006.01)
  *H01L 27/12* (2006.01)

(52) U.S. Cl.
  CPC ...... *H01L 27/1248* (2013.01); *H01L 51/0043* (2013.01); *C08F 220/281* (2020.02); *C08F 220/282* (2020.02); *C08F 220/325* (2020.02); *C08J 2333/14* (2013.01)

(58) Field of Classification Search
  CPC ................ C08F 220/28; C08F 220/281; C08F 220/282; C08F 220/32; C08F 220/325; C08J 3/24; C08J 5/18; C08J 2333/14; C09D 133/14; G02F 1/133345; G02F 1/133357; G03F 7/022; G03F 7/0233
  See application file for complete search history.

(56) References Cited

U.S. PATENT DOCUMENTS

| | | | | |
|---|---|---|---|---|
| 2011/0294243 | A1* | 12/2011 | Jeon | G02F 1/13439 438/29 |
| 2012/0021190 | A1* | 1/2012 | Aoki | C09D 183/02 428/195.1 |
| 2012/0251949 | A1 | 10/2012 | Miyabe et al. | |
| 2014/0240645 | A1* | 8/2014 | Shim | H01L 27/3258 349/86 |
| 2014/0327866 | A1* | 11/2014 | Kang | G03F 7/0045 349/138 |
| 2016/0195810 | A1* | 7/2016 | Shim | G03F 7/0233 257/40 |

FOREIGN PATENT DOCUMENTS

| | | |
|---|---|---|
| KR | 10-1249997 B1 | 4/2013 |
| KR | 10-2017-0128678 A | 11/2017 |

* cited by examiner

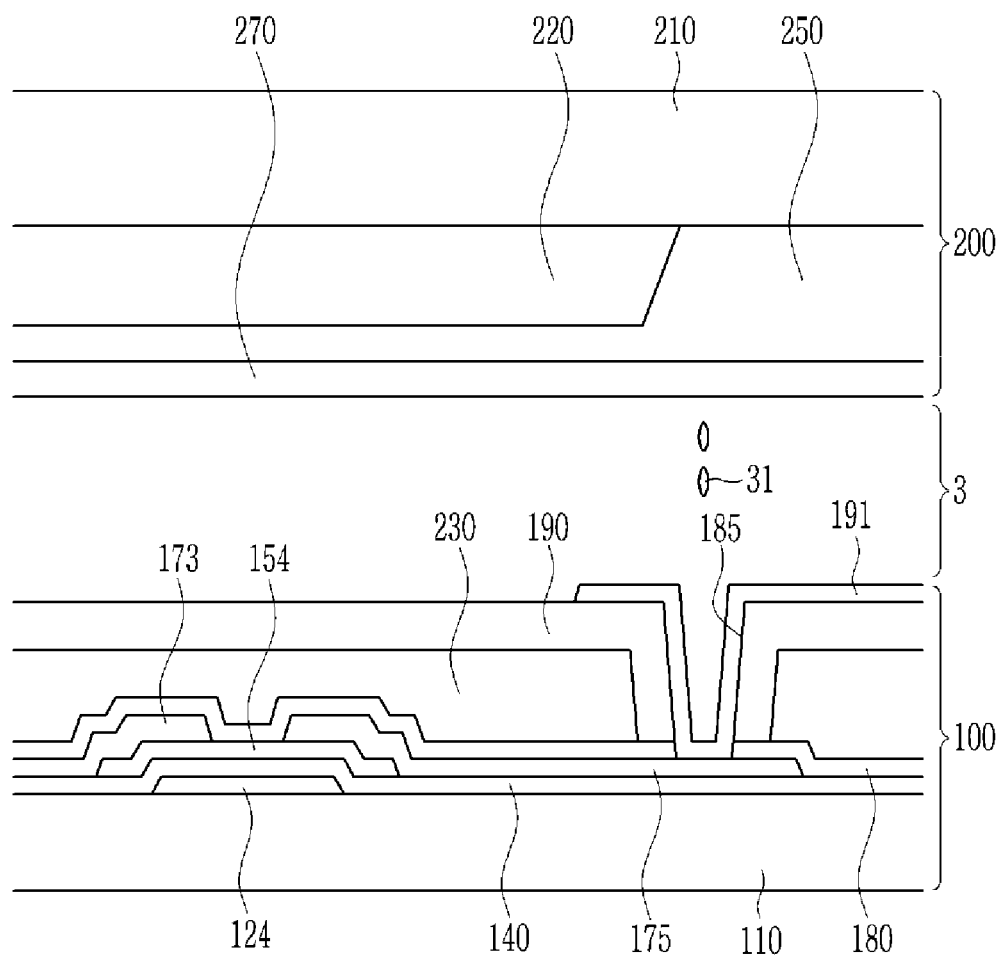

PHOTOSENSITIVE RESIN COMPOSITION AND DISPLAY DEVICE INCLUDING THE SAME

CROSS-REFERENCE TO RELATED APPLICATION

This application claims priority to and the benefit of Korean Patent Application No. 10-2018-0116423 filed in the Korean Intellectual Property Office on Sep. 28, 2018, the entire contents of which are incorporated herein by reference.

BACKGROUND

1. Field

Embodiments of the present disclosure relate to a photosensitive resin composition and a display device including the same.

2. Description of the Related Art

In general, a widely used display device includes a liquid crystal display (LCD), an organic light emitting device (OLED), and the like.

The liquid crystal display (LCD) and the organic light emitting device (OLED) may include an insulating film included to insulate between wirings or a planarization film included to planarize between wirings.

The above information disclosed in this Background section is only for enhancement of understanding of the background of the present disclosure, and therefore, it may contain information that does not form the prior art that is already known in this country to a person of ordinary skill in the art.

SUMMARY

Embodiments of the present disclosure have been made in an effort to provide a photosensitive resin composition having features of excellent resolution, a curing process margin, transparency, heat resistant discoloration, and heat resistance, and particularly excellent sensitivity and adhesion, and a display device including the same.

An exemplary embodiment of the present disclosure provides a photosensitive resin composition including: a) an acryl-based copolymer obtained by copolymerizing i) a hydroxyl group-containing unsaturated compound; ii) an unsaturated carboxylic acid, an unsaturated carboxylic anhydride, or a mixture thereof; iii) an epoxy group-containing unsaturated compound; and iv) an olefin-based unsaturated compound, b) a 1,2-quinonediazide 5-sulfonic ester compound having a phenol compound including a compound represented by the following Chemical Formula A as ballast, c) a silane coupling agent, and d) a solvent:

Chemical Formula A

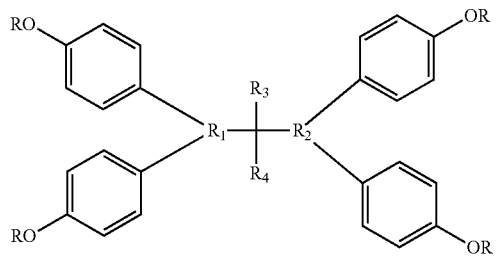

wherein $R_1$ and $R_2$ are cyclopropane, cyclobutane, cyclopentane, or an alkyl group having 0 to 4 carbon atoms or an alkoxy group having 0 to 4 carbon atoms, respectively, $R_3$ and $R_4$ are H or $CH_3$, respectively, and R is independently H, $CH_3$, or

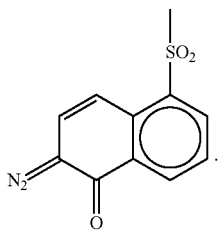

The hydroxyl group-containing unsaturated compound may include at least one selected from compounds represented by the following Chemical Formulae 1 to 8:

Chemical Formula 1

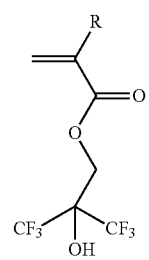

Chemical Formula 2

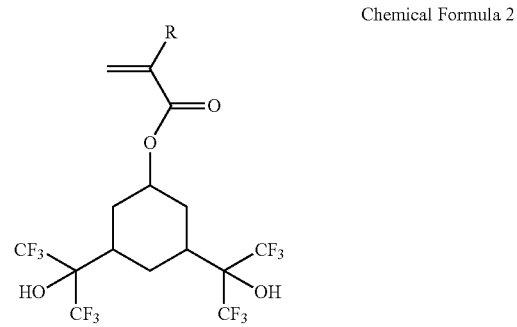

Chemical Formula 3

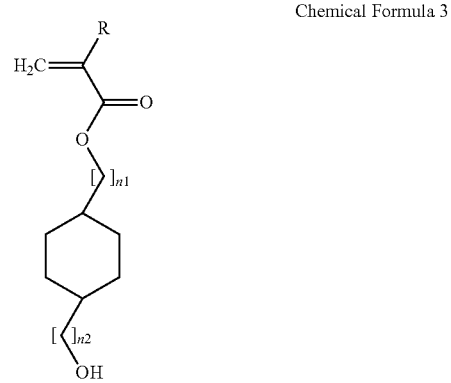

Chemical Formula 4

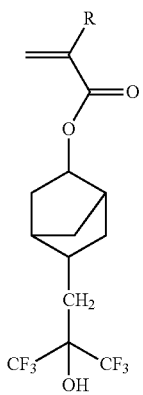

Chemical Formula 5

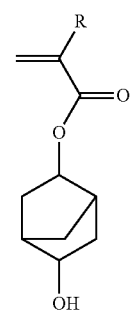

Chemical Formula 6

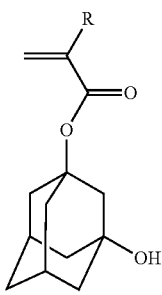

Chemical Formula 7

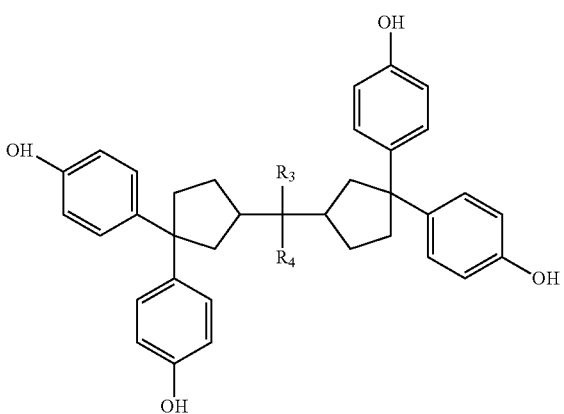

Chemical Formula 8

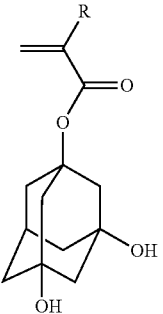

wherein R is independently H or $CH_3$, and $n_1$ and $n_2$ are an integer of 0 to 4, respectively.

The photosensitive resin composition may further include a compound represented by the following Chemical Formula B:

Chemical Formula B

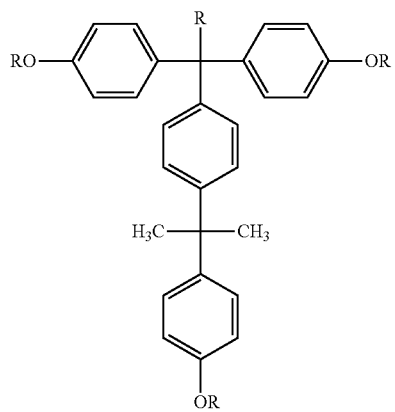

wherein R is H, $CH_3$, or

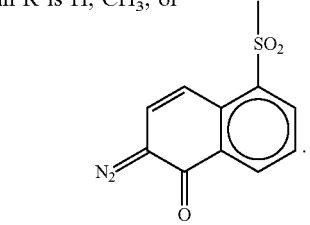

The compound represented by Chemical Formula A may include at least one selected from compounds represented by the following Chemical Formulae A-1, A-2, A-3, A-4, A-5, and A-6:

Chemical Formula A-1

Chemical Formula A-2
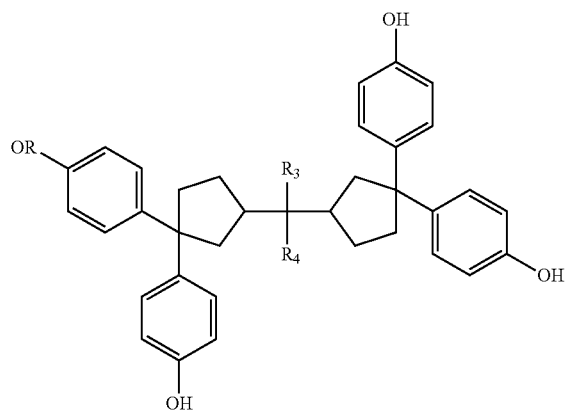
Chemical Formula A-3
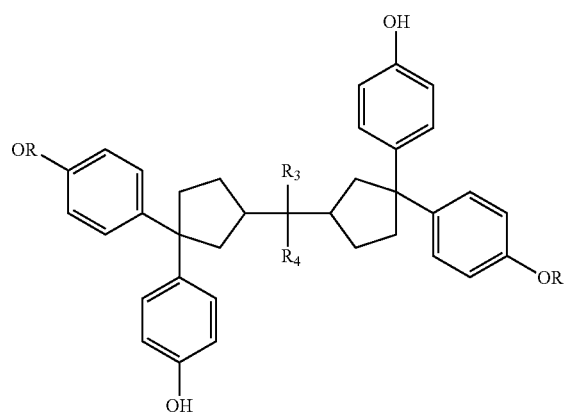
Chemical Formula A-4
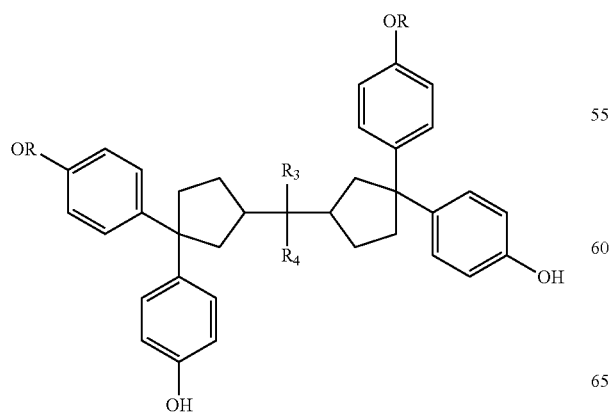
Chemical Formula A-5
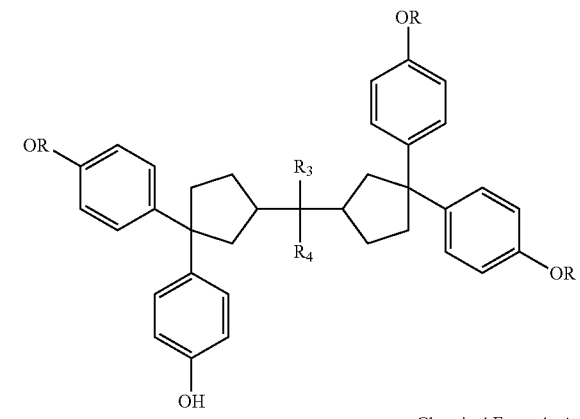
Chemical Formula A-6
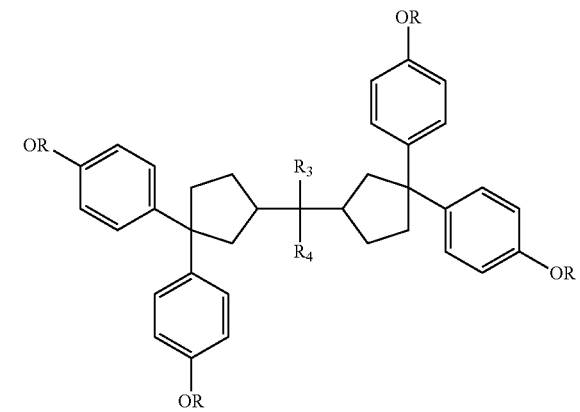
wherein $R_3$ and $R_4$ are H or $CH_3$, respectively, and R is
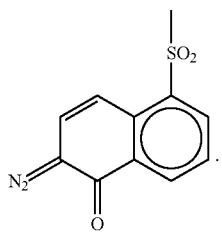
The photosensitive resin composition may include at least one selected from compounds represented by the following Chemical Formulae B-1, B-2, B-3, B-4, and B-5:
Chemical Formula B-1
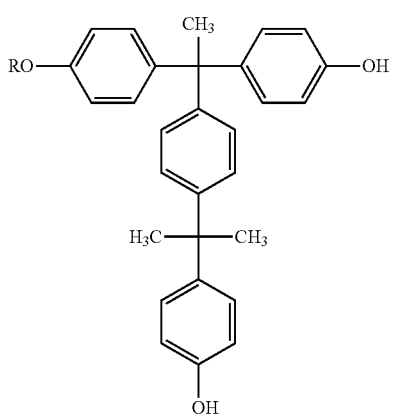

Chemical Formula B-2

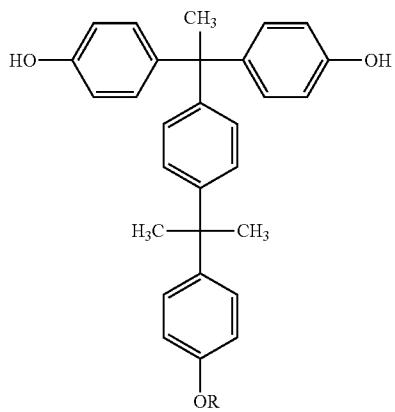

Chemical Formula B-3

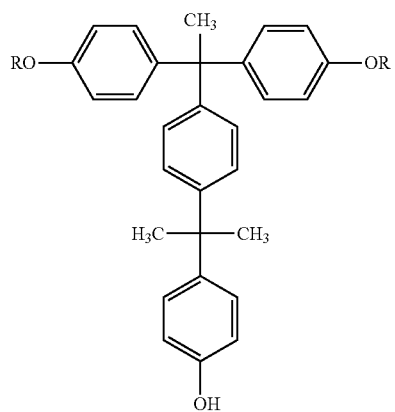

Chemical Formula B-4

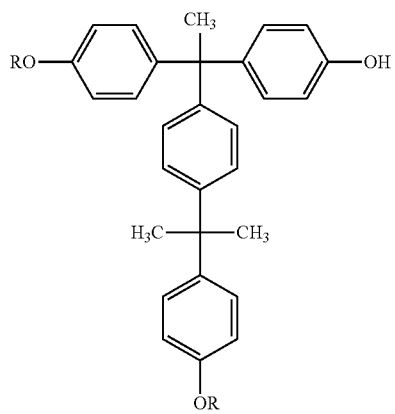

Chemical Formula B-5

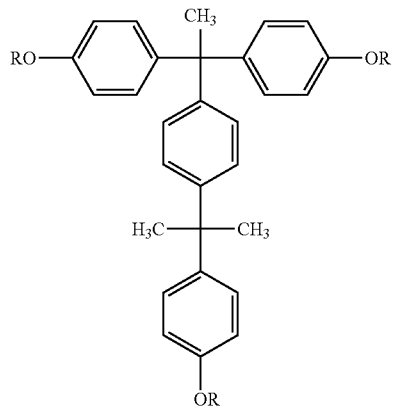

wherein R is

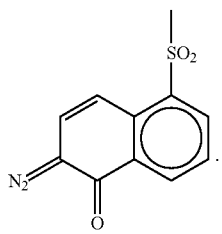

The photosensitive resin composition may include a) 100 parts by weight of the acryl-based copolymer obtained by copolymerizing i) 5 to 70 parts by weight of the hydroxyl group-containing unsaturated compound; ii) 5 to 40 parts by weight of the unsaturated carboxylic acid, unsaturated carboxylic anhydride, or the mixture thereof; iii) 10 to 70 parts by weight of the epoxy group-containing unsaturated compound; and iv) 5 to 70 parts by weight of the olefin-based unsaturated compound, b) 5 to 50 parts by weight of the 1,2-quinonediazide 5-sulfonic ester compound having the phenol compound including the compound represented by Chemical Formula A as ballast, or the 1,2-quinonediazide 5-sulfonic ester compound having a phenol compound including the compound represented by Chemical Formula A and a compound represented by Chemical Formula B as ballast, and c) 0.1 to 30 parts by weight of the silane coupling agent.

The solvent may be included so that a solid content including a), b), and c) is 10 to 50 wt %, based on the total weight of the photosensitive resin composition.

The unsaturated carboxylic acid, unsaturated carboxylic anhydride or the mixture thereof of a)ii) may include one or more selected from the group consisting of an acrylic acid, a methacrylic acid, a maleic acid, a fumaric acid, a citraconic acid, a metaconic acid, an itaconic acid, and an unsaturated dicarboxylic anhydride thereof.

The epoxy group-containing unsaturated compound of a)iii) may include one or more selected from the group consisting of glycidyl acrylate, glycidyl methacrylate, glycidyl α-ethyl acrylate, glycidyl α-n-propyl acrylate, glycidyl α-n-butyl acrylate, β-methylglycidyl acrylate, β-methylglycidyl methacrylate, β-ethylglycidyl acrylate, β-ethylglycidyl methacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethyl acrylate, o-vinylbenzylglycidyl ether, m-vinylbenzylglycidyl ether and p-vinylbenzylglycidyl ether, 3,4-epoxycyclohexyl methacrylate, 3,4-epoxycyclohexylmethyl methacrylate, 3,4-epoxycyclohexyl acrylate, and 3,4-epoxycyclohexylmethyl acrylate.

The olefin-based unsaturated compound of a)iv) may include one or more selected from the group consisting of methyl methacrylate, ethyl methacrylate, n-butyl methacrylate, sec-butyl methacrylate, tert-butyl methacrylate, methyl acrylate, isopropyl acrylate, cyclohexyl methacrylate, 2-methylcyclohexyl methacrylate, dicyclopentenyl acrylate, dicyclopentanyl acrylate, dicyclopentenyl methacrylate, dicyclopentanyl methacrylate, 1-adamantyl acrylate, 1-adamantyl methacrylate, dicyclopentanyloxyethyl methacrylate, isoboronyl methacrylate, cyclohexyl acrylate, 2-methylcyclohexyl acrylate, dicyclopentanyloxyethyl acrylate, isoboronyl acrylate, phenyl methacrylate, phenyl acrylate, benzyl acrylate, 2-hydroxyethyl methacrylate, styrene, σ-methyl styrene, m-methyl styrene, p-methyl styrene, vinyltoluene, p-methoxystyrene, 1,3-butadiene, isoprene, and 2,3-dimethyl 1,3-butadiene.

The acryl-based copolymer of a) may have a weight average molecular weight (Mw) in terms of polystyrene of 3,000 to 20,000.

The silane coupling agent of c) may include one or more selected from the group consisting of (3-glycidoxypropyl)trimethoxysilane, (3-glycidoxypropyl)triethoxysilane, (3-glycidoxypropyl)methyldimethoxysilane, (3-glycidoxypropyl)methyldiethoxysilane, (3-glycidoxypropyl)dimethylethoxysilane, 3,4-epoxybutyltrimethoxysilane, 3,4-epoxybutyltriethoxysilane, 2-(3,4-epoxycyclohexyl)ethyltrimethoxysilane, 2-(3,4-epoxycyclohexyl)ethyltriethoxysilane, aminopropyltrimethoxysilane, aminopropyltriethoxysilane, 3-triethoxysilyl-N-(1,3-dimethyl-butylidene)propylamine, N-(2-aminoethyl)-3-aminopropyltrimethoxysilane, N-(2-aminoethyl)-3-aminopropyltriethoxysilane, N-(2-aminoethyl)-3-aminopropylmethyldimethoxysilane, N-phenyl-3-aminopropyltrimethoxysilane, and (3-isocyanatopropyl)triethoxysilane.

The solvent of d) may include one or more selected from the group consisting of diethylene glycol dimethyl ether, diethylene glycol methylethyl ether, propylene glycol methyl ether acetate, propylene glycol ethyl ether acetate, propylene glycol propyl ether acetate, propylene glycol methyl ether propionate, propylene glycol ethyl ether propionate, propylene glycol propyl ether propionate, propylene glycol methyl ether, propylene glycol ethyl ether, propylene glycol propyl ether, propylene glycol butyl ether, dipropylene glycol dimethyl ether, dipropylene glycol diethyl ether, butylene glycol monomethyl ether, butylene glycol monoethyl ether, dibutylene glycol dimethyl ether, dibutylene glycol diethyl ether, diethylene glycol butylmethyl ether, diethylene glycol butylethyl ether, triethylene glycol dimethyl ether, triethylene glycol butylmethyl ether, diethylene glycol tert-butyl ether, tetraethylene glycol dimethyl ether, diethylene glycol ethylhexyl ether, diethylene glycol methylhexyl ether, dipropylene glycol butylmethyl ether, dipropylene glycol ethylhexyl ether, and dipropylene glycol methylhexyl ether.

The display device according to an exemplary embodiment includes a cured body (e.g., a cured product) of the photosensitive resin composition as described above.

The display device may include an organic insulating film including the cured body of the photosensitive resin composition.

The display device may further include a substrate, a thin film transistor on the substrate, a pixel electrode coupled with the thin film transistor, and a color filter superimposed on the thin film transistor.

The color filter may be between the organic insulating film and the thin film transistor.

The display device according to an exemplary embodiment includes a substrate, a thin film transistor on the substrate, a pixel electrode coupled with the thin film transistor, and an organic insulating film superimposed on the substrate, and the organic insulating film includes a cured body (e.g., a cured product) of a photosensitive resin composition including: a) an acryl-based copolymer obtained by copolymerizing i) a hydroxyl group-containing unsaturated compound; ii) an unsaturated carboxylic acid, an unsaturated carboxylic anhydride, or a mixture thereof; iii) an epoxy group-containing unsaturated compound; and iv) an olefin-based unsaturated compound, b) a 1,2-quinonediazide 5-sulfonic ester compound having a phenol compound including a compound represented by the following Chemical Formula A as ballast, and c) a silane coupling agent.

Chemical Formula A

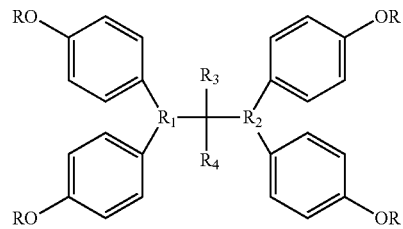

wherein $R_1$ and $R_2$ are cyclopropane, cyclobutane, or cyclopentane, respectively, $R_3$ and $R_4$ are H or $CH_3$, respectively, and R is independently H, $CH_3$ or

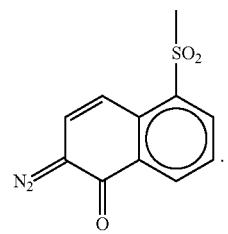

According to exemplary embodiments, the photosensitive resin composition has excellent resolution, curing process margin, transparency, heat resistant discoloration, and heat resistance, and particularly may have excellent sensitivity and adhesion. In addition, the display device including an organic insulating film or planarization film formed of the photosensitive resin composition may have improved reliability.

BRIEF DESCRIPTION OF THE DRAWINGS

The accompanying drawing, together with the specification, illustrates an embodiment of the subject matter of the present disclosure, and, together with the description, serves to explain principles of embodiments of the subject matter of the present disclosure. The accompanying drawing is a schematic cross-sectional view for a portion of one pixel according to an exemplary embodiment.

DETAILED DESCRIPTION

Hereinafter, various exemplary embodiments of the present disclosure will be described in more detail so as to be easily carried out by a person skilled in the art to which the present disclosure pertains, referring to the accompanying drawing. The subject matter of the present disclosure may be implemented in various different forms, and is not limited to the exemplary embodiments described herein.

In order to clearly describe the subject matter of the present disclosure, parts unrelated to the relevant description are omitted, and the same reference numeral indicates the same or like constituent element throughout this specification.

In addition, because the size and the thickness of each component shown in the drawing may optionally be represented for convenience of description, the present disclosure is not necessarily limited to those shown in the drawing.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, being "over" or "on" a reference element is understood to be "on" or "under" the reference element, but is not understood to be necessarily "on" or "over" in an opposite direction of gravity.

In addition, unless explicitly described to the contrary, the word "comprise" and variations such as "comprises" or "comprising", will be understood to imply the inclusion of stated elements, but not the exclusion of any other elements.

In addition, throughout this specification, the term "on a plane" refers to when an object is viewed from above, and the term "on a section" refers to when a section of a vertically cut object is viewed from the side.

Hereinafter, a photosensitive resin composition according to an exemplary embodiment will be described.

The photosensitive resin composition according to an exemplary embodiment may include: a) an acryl-based copolymer obtained by copolymerizing i) a hydroxyl group-containing unsaturated compound including at least one selected from compounds represented by the following Chemical Formulae 1 to 8; ii) an unsaturated carboxylic acid, an unsaturated carboxylic anhydride, or a mixture thereof; iii) an epoxy group-containing unsaturated compound; and iv) an olefin-based unsaturated compound, b) a 1,2-quinonediazide 5-sulfonic ester compound having a phenol compound including a compound represented by the following Chemical Formula A as ballast, c) a silane coupling agent, and d) a solvent. In addition, the photosensitive resin composition according to an exemplary embodiment may further include a compound represented by the following Chemical Formula B.

Chemical Formula 1

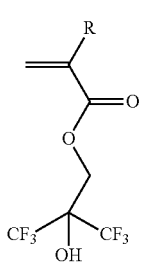

Chemical Formula 2

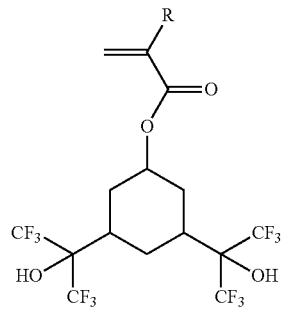

Chemical Formula 3

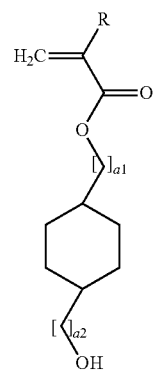

Chemical Formula 4

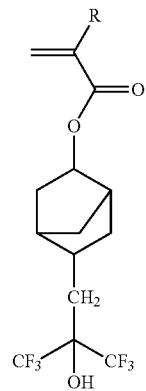

Chemical Formula 5

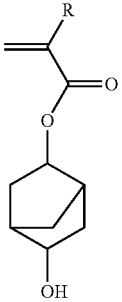

-continued

Chemical Formula 6

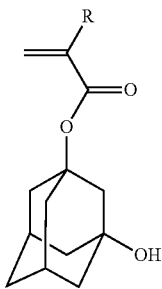

Chemical Formula 7

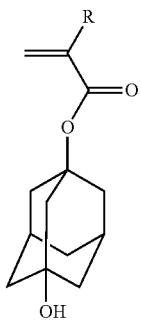

Chemical Formula 8

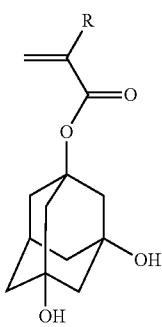

wherein R is H or CH$_3$, and n1 and n2 are independently of each other an integer of 0 to 4.

Chemical Formula A

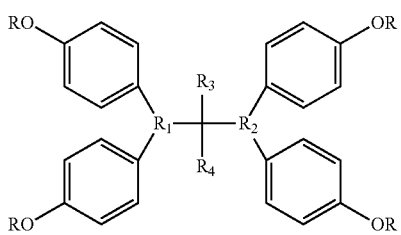

-continued

Chemical Formula B

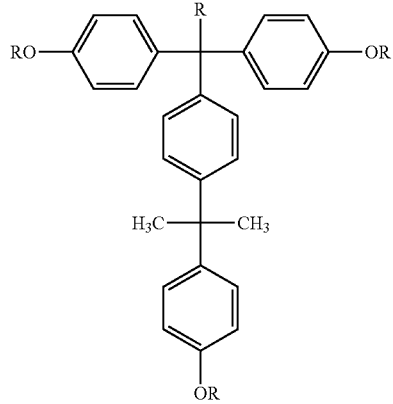

wherein R is H, CH$_3$, or

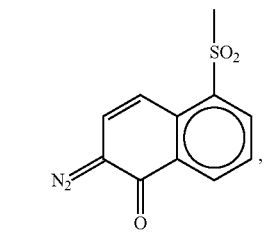

R$_1$ and R$_2$ are independently of each other cyclopropane, cyclobutane, cyclopentane, an alkyl group, or an alkoxy group having 0 to 4 carbon atoms, and R$_3$ and R$_4$ are independently of each other H or CH$_3$.

The photosensitive resin composition according to an exemplary embodiment may include: a) 100 parts by weight of the acryl-based copolymer obtained by copolymerizing i) 5 to 70 parts by weight of the hydroxyl group-containing unsaturated compound including at least one selected from compounds represented by the following Chemical Formulae 1 to 8; ii) 5 to 40 parts by weight of the unsaturated carboxylic acid, unsaturated carboxylic anhydride, or the mixture thereof; iii) 10 to 70 parts by weight of the epoxy group-containing unsaturated compound; and iv) 5 to 70 parts by weight of the olefin-based unsaturated compound, b) 5 to 50 parts by weight of the 1,2-quinonediazide 5-sulfonic ester compound having the phenol compound including the compound represented by Chemical Formula A as ballast, or the 1,2-quinonediazide 5-sulfonic ester compound having a phenol compound including the compound represented by Chemical Formula A and a compound represented by Chemical Formula B as ballast, c) 0.1 to 30 parts by weight of the silane coupling agent, and d) a solvent so that a solid content in the photosensitive resin composition is 10 to 50 wt %.

Hereinafter, the components used in the photosensitive resin composition according to an exemplary embodiment will be described in more detail.

The acryl-based copolymer of a) according to an exemplary embodiment may be obtained by using i) the hydroxyl group-containing unsaturated compound including at least one selected from compounds represented by Chemical Formulae 1 to 8, ii) the unsaturated carboxylic acid, the unsaturated carboxylic anhydride, or the mixture thereof, iii) the epoxy group-containing unsaturated compound, and iv)

the olefin-based unsaturated compound as monomers. The compounds of i) to iv) are subjected to a radical reaction in the presence of a solvent and a polymerization initiator to perform the synthesis reaction, and then unreacted monomers are removed by a purification process, thereby obtaining the acryl-based copolymer.

The hydroxyl group-containing unsaturated compound of a)i) including at least one selected from compounds represented by Chemical Formulae 1 to 8 may be included at 5 to 70 parts by weight, based on the entire weight of monomers. When the content is less than 5 parts by weight, the sensitivity of the photosensitive resin composition may be decreased, and when the content is more than 70 parts by weight, solubility in an aqueous alkaline solution may be excessively increased.

As the unsaturated carboxylic acid, the unsaturated carboxylic anhydride, or the mixture thereof of a)ii), unsaturated monocarboxylic acids such as an acrylic acid and a methacrylic acid, unsaturated dicarboxylic acids such as a maleic acid, a fumaric acid, a citraconic acid, a metaconic acid, and an itaconic acid, or unsaturated dicarboxylic anhydrides thereof, or the like may be used alone or in combination of two or more. As an example, an acrylic acid, a methacrylic acid, or anhydrous maleic acid may be included. When the acrylic acid, the methacrylic acid, or the anhydrous maleic acid is used, copolymerization reactivity is excellent and solubility in an aqueous alkaline solution which is a developing solution may be suitable or appropriate.

The unsaturated carboxylic acid, the unsaturated carboxylic anhydride, or the mixture thereof may be included at 5 to 40 parts by weight, based on the entire weight of monomers. When the content is less than 5 parts by weight, it may be difficult for the unsaturated carboxylic acid, the unsaturated carboxylic anhydride, or the mixture to be dissolved in the aqueous alkaline solution, and when the content is more than 40 parts by weight, solubility in the aqueous alkaline solution may be excessively or unsuitably increased.

The epoxy group-containing unsaturated compound of a)iii) may include glycidyl acrylate, glycidyl methacrylate, glycidyl α-ethyl acrylate, glycidyl α-n-propyl acrylate, glycidyl α-n-butyl acrylate, β-methylglycidyl acrylate, β-methylglycidyl methacrylate, β-ethylglycidyl acrylate, β-ethylglycidyl methacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethyl acrylate, o-vinylbenzylglycidyl ether, m-vinylbenzylglycidyl ether or p-vinylbenzylglycidyl ether, 3,4-epoxycyclohexyl methacrylate, or the like, and the compounds may be used alone or in combination of two or more. As an example, the epoxy group-containing unsaturated compound may include at least one selected from glycidyl methacrylate, β-methylglycidyl methacrylate, 6,7-epoxyheptyl methacrylate, o-vinylbenzylglycidyl ether, m-vinylbenzylglycidyl ether or p-vinylbenzylglycidyl ether, 3,4-epoxycyclohexyl methacrylate, or the like, thereby improving copolymerization reactivity and heat resistance of a pattern obtained from the photosensitive resin composition.

The epoxy group-containing unsaturated compound may be included at 10 to 70 parts by weight, based on the entire weight of monomers. Within this range, heat resistance of the organic insulating film and storage stability of the photosensitive resin composition may be suitable or satisfied concurrently (e.g., at the same or substantially the same time).

The olefin-based unsaturated compound of a)iv) may include methyl methacrylate, ethyl methacrylate, n-butyl methacrylate, sec-butyl methacrylate, tert-butyl methacrylate, methyl acrylate, isopropyl acrylate, cyclohexyl methacrylate, 2-methylcyclohexyl methacrylate, dicyclopentenyl acrylate, dicyclopentanyl acrylate, dicyclopentenyl methacrylate, dicyclopentanyl methacrylate, 1-adamantyl acrylate, 1-adamantyl methacrylate, dicyclopentanyloxyethyl methacrylate, isoboronyl methacrylate, cyclohexyl acrylate, 2-methylcyclohexyl acrylate, dicyclopentanyloxyethyl acrylate, isoboronyl acrylate, phenyl methacrylate, phenyl acrylate, benzyl acrylate, 2-hydroxyethyl methacrylate, styrene, σ-methyl styrene, m-methyl styrene, p-methylstyrene, vinyltoluene, p-methoxystyrene, 1,3-butadiene, isoprene or 2,3-dimethyl 1,3-butadiene, or the like, and the compounds may be used alone or in combination of two or more.

The olefin-based unsaturated compound may be included at 5 to 70 parts by weight, based on the entire weight of monomers. Within this range, occurrence of swelling after development of the photosensitive resin composition may be suppressed or reduced, and appropriate or suitable solubility in the aqueous alkaline solution which is a developing solution may be provided.

The solvent and the polymerization initiator may be further included for forming the acryl-based copolymer using the monomer. As an example, the solvent may include one or more selected from methanol, tetrahydroxyfuran, toluene, and dioxane. The polymerization initiator may include a radical polymerization initiator, and as an example, 2,2-azobisisobutyronitrile, 2,2-azobis(2,4-dimethylvaleronitrile), 2,2-azobis(4-methoxy 2,4-dimethylvaleronitrile), 1,1-azobis(cyclohexane-1-carbonitrile), dimethyl 2,2'-azobisisobutylate, or the like may be included.

The acryl-based copolymer which is obtained by subjecting the above monomers to a radical reaction in the presence of a solvent and a polymerization initiator to perform synthesis and removing unreacted monomers by a purification process may have a weight average molecular weight (Mw) in terms of polystyrene of 3,000 to 20,000. When the weight average molecular weight in terms of polystyrene is less than 3000, developability or a residual film ratio may be deteriorated or reduced, or pattern development or heat resistance may be deteriorated or reduced, and when the weight average molecular weight is more than 20,000, pattern development may be deteriorated or reduced.

b) The 1,2-quinonediazide 5-sulfonic ester compound having the phenol compound including the compound represented by Chemical Formula A or B as ballast may be obtained by reacting a 1,2-quinonediazide 5-sulfonic acid halogen compound and the phenol compound under (e.g., in the presence of) a weak base.

The photosensitive resin composition according to an exemplary embodiment includes a 1,2-quinonediazide 5-sulfonic ester compound having a phenol compound represented by Chemical Formula A as ballast, and may further include a 1,2-quinonediazide 5-sulfonic ester compound having a compound represented by Chemical Formula B as ballast.

The photosensitive resin composition according to an exemplary embodiment may include at least one selected from compounds represented by Chemical Formulae A-1, A-2, A-3, A-4, A-5 and A-6, as an example of the 1,2-quinonediazide 5-sulfonic ester compound:

Chemical Formula A-1
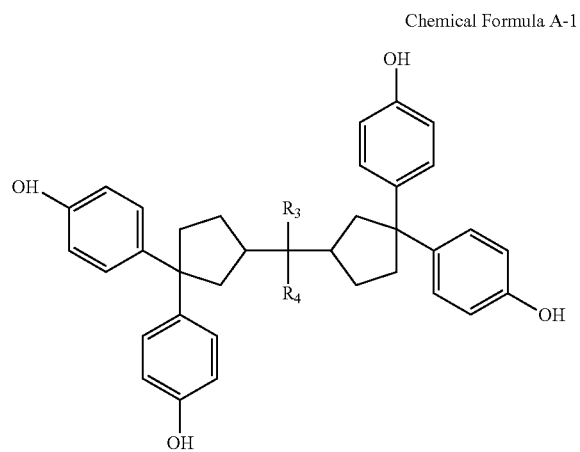
Chemical Formula A-2
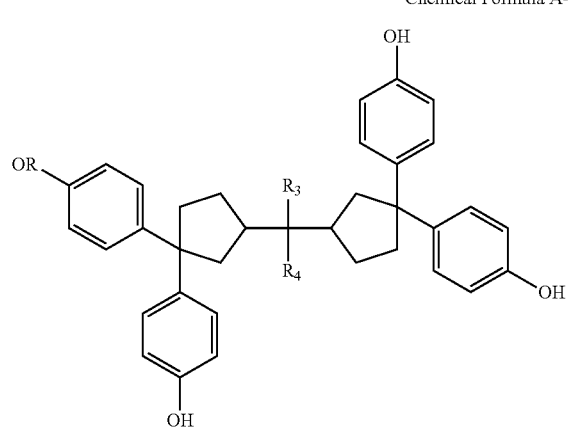
Chemical Formula A-3
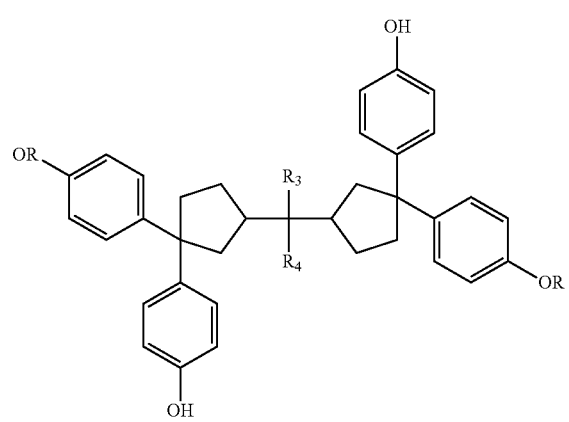
Chemical Formula A-4
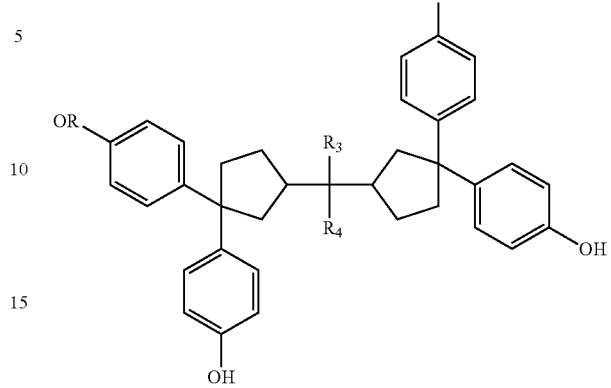
Chemical Formula A-5
Chemical Formula A-6
wherein $R_3$ and $R_4$ are H or $CH_3$, respectively, and R is
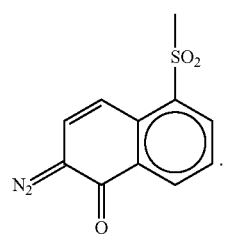
The photosensitive resin composition according to an exemplary embodiment may further include at least one selected from compounds represented by the following Chemical Formulae B-1, B-2, B-3, B-4, and B-5, as an example of the 1,2-quinonediazide 5-sulfonic ester compound:

Chemical Formula B-1

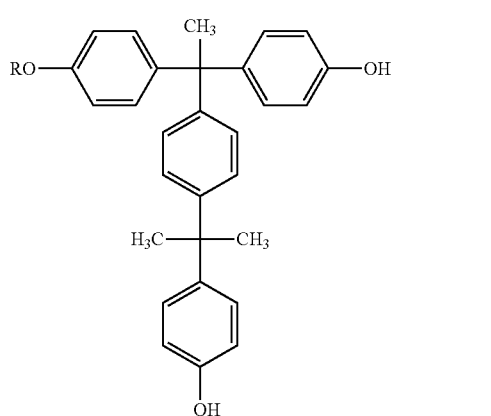

Chemical Formula B-2

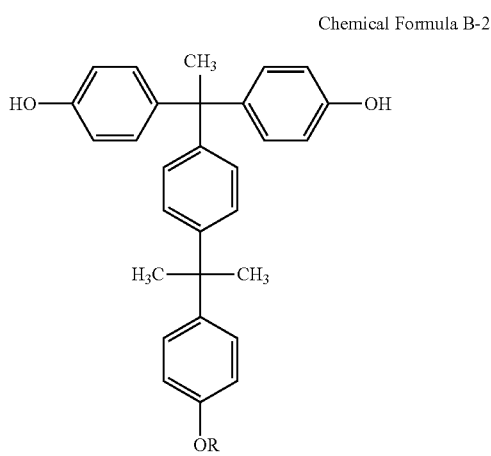

Chemical Formula B-3

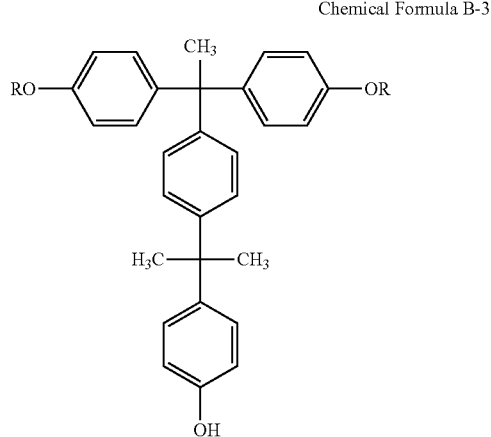

Chemical Formula B-4

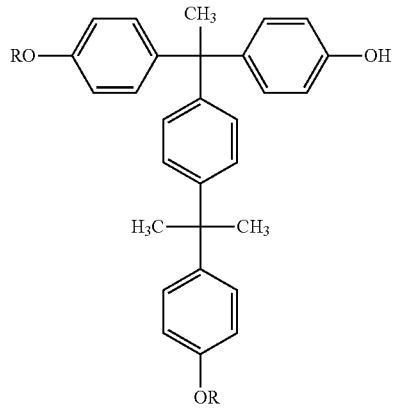

Chemical Formula B-5

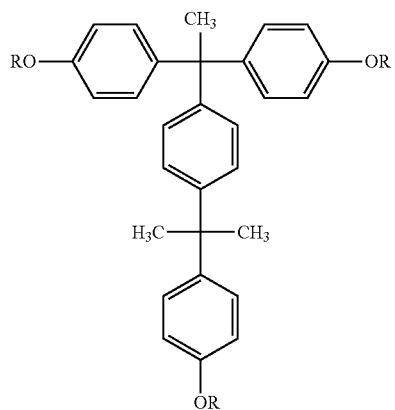

wherein R is

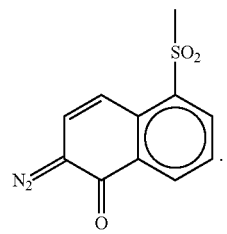

At least one selected from compounds represented by Chemical Formulae A-1 to A-6 and Chemical Formulae B-1 to B-5 may react with a compound including an —OH group in a light exposure process to form a cured body (e.g., a cured product), which may be represented as follows:

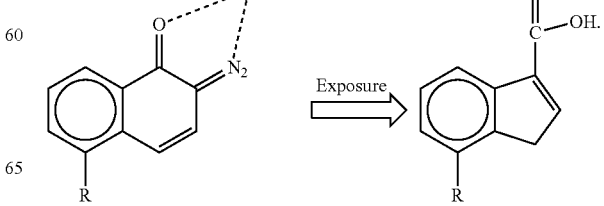

The 1,2-quinonediazide 5-sulfonic compound may be included at 5 to 50 parts by weight, based on 100 parts by weight of a) the acryl-based copolymer. When the content is less than 5 parts by weight, a solubility difference between an exposed portion and an unexposed portion is decreased, whereby pattern formation may be difficult, and when the content is more than 50 parts by weight, an unreacted 1,2-quinonediazide 5-sulfonic ester compound remains in a large amount when light is irradiated for a short time to excessively or unsuitably lower solubility in an aqueous alkaline solution, which is a developing solution, thereby rendering development difficult.

The silane coupling agent of c) may improve adhesion to a lower substrate. The silane coupling agent may include (3-glycidoxypropyl)trimethoxysilane, (3-glycidoxypropyl)triethoxysilane, (3-glycidoxypropyl)methyldimethoxysilane, (3-glycidoxypropyl)methyldiethoxysilane, (3-glycidoxypropyl)dimethylethoxysilane, 3,4-epoxybutyltrimethoxysilane, 3,4-epoxybutyltriethoxysilane, 2-(3,4-epoxycyclohexyl)ethyltrimethoxysilane, 2-(3,4-epoxycyclohexyl)ethyltriethoxysilane, aminopropyltrimethoxysilane, aminopropyltriethoxysilane, 3-triethoxysilyl-N-(1,3-dimethyl-butylidene)propylamine, N-(2-aminoethyl)-3-aminopropyltrimethoxysilane, N-(2-aminoethyl)-3-aminopropyltriethoxysilane, N-(2-aminoethyl)-3-aminopropylmethyldimethoxysilane, N-phenyl-3-aminopropyltrimethoxysilane, (3-isocyanatopropyl)triethoxysilane, (3-isocyanatopropyl)trimethoxysilane, or the like, as an example, which may be used alone or in combination of two or more.

The content of the silane coupling agent may be 0.1 to 30 parts by weight, based on 100 parts by weight of c) the acryl-based copolymer. When the content is less than 0.1 parts by weight, adhesion to the lower substrate is decreased, and when the content is more than 30 parts by weight, storage stability and developability are deteriorated or reduced and resolution may be deteriorated or reduced.

The solvent of d) may include one or more selected from the group consisting of diethylene glycol dimethyl ether, diethylene glycol methylethyl ether, propylene glycol methyl ether acetate, propylene glycol ethyl ether acetate, propylene glycol propyl ether acetate, propylene glycol methyl ether propionate, propylene glycol ethyl ether propionate, propylene glycol propyl ether propionate, propylene glycol methyl ether, propylene glycol ethyl ether, propylene glycol propyl ether, propylene glycol butyl ether, dipropylene glycol dimethyl ether, dipropylene glycol diethyl ether, butylene glycol monomethyl ether, butylene glycol monoethyl ether, dibutylene glycol dimethyl ether and dibutylene glycol diethyl ether, diethylene glycol butylmethyl ether, diethylene glycol butylethyl ether, triethylene glycol dimethyl ether, triethylene glycol butylmethyl ether, diethylene glycol tert-butyl ether, tetraethylene glycol dimethyl ether, diethylene glycol ethylhexyl ether, diethylene glycol methylhexyl ether, dipropylene glycol butylmethyl ether, dipropylene glycol ethylhexyl ether, and dipropylene glycolmethylhexyl ether.

The solvent of d) may be included so that the solid content of the photosensitive resin composition is 10 to 50 wt %. When the solid content is less than 10 wt %, a coated thickness is small so that a coating uniformity may be reduced, and when the solid content is more than 50 wt %, a coated thickness is large and coating equipment may overwork during coating.

As an example, when the solid content of the entire photosensitive resin composition is 10 to 25 wt %, a slit coater is used, and when the solid content is 25 to 50 wt %, a spin coater or a slit & spin coater may be used.

The photosensitive resin composition according to an exemplary embodiment may have a solid content concentration of 10 to 50 wt %, and be used after being filtered with a millipore filter or the like of 0.1 μm to 0.2 μm.

In a process of manufacturing the display device using the above-described photosensitive resin composition, an embodiment of a method of forming an insulating film is as follows.

The photosensitive resin composition according to an exemplary embodiment is coated on a substrate surface by spin coating, slit & spin coating, slit coating, or roll coating. Thereafter, the solvent is removed by free bake to form a coating film. At this time, the free bake may be performed at a temperature of 100° (° C.) to 120° (° C.) for 1 minute to 3 minutes.

Next, visible ray, ultraviolet rays, far-ultraviolet rays, an electron beam, X-rays, and/or the like are irradiated on the formed coating film according to the previously prepared pattern, and development is performed with a developing solution to remove unnecessary or undesired parts, thereby forming a set or predetermined pattern.

As the developing solution, an aqueous alkaline solution may be used. As an example, one or more of aqueous solution of inorganic alkalis such as sodium hydroxide, potassium hydroxide, and sodium carbonate; primary amines such as ethylamine and n-propylamine; secondary amines such as diethylamine and n-propylamine; tertiary amines such as trimethylamine, methyldiethylamine, dimethylethylamine, and triethylamine; alcohol amines such as dimethylethanol amine, methyldiethanol amine, and triethanol amine; or quaternary ammonium salts such as tetramethylammonium hydroxide and tetraethylammonium hydroxide may be used.

The developing solution may include the alkaline compound at a concentration of 0.1 to 10 parts by weight, and an appropriate or suitable amount of an aqueous organic solvent such as methanol and ethanol and a surfactant.

The coating film is developed with the developing solution, washed with ultrapure water for 30 seconds to 90 seconds to remove unnecessary or undesired parts and dried, thereby forming a pattern.

Light such as, for example, ultraviolet light, is irradiated on the formed pattern, and heating treatment is performed at a temperature of 150° (° C.) to 400° (° C.) for 30 minutes to 90 minutes by a heating device such as an oven, thereby obtaining a final pattern.

The final pattern may include a cured body (e.g., a cured product) formed of the above-described photosensitive resin composition. The description of the photosensitive resin composition will not be repeated unnecessarily hereinafter.

Hereinafter, the display device including the cured body (e.g., the cured product) of the above-described photosensitive resin composition will be described, referring to the accompanying drawing. The accompanying drawing is a cross-sectional view briefly showing a portion of one pixel included in the display device.

Referring to the accompanying drawing, a lower panel 100 is on a substrate 110 and includes a gate line including a gate electrode 124. A gate insulating film 140 is on a gate electrode 124, and a semiconductor layer 154 is on a gate insulating film 140 superimposed on the gate electrode 124.

Then, a data line including a source electrode 173 and a drain electrode 175 are on the semiconductor layer 154. The source electrode 173 and the drain electrode 175 may face each other around a channel region included in the semiconductor layer 154.

The gate electrode 124, the semiconductor layer 154, the source electrode 173, and the drain electrode 175 form one thin film transistor, and a channel may be formed on the semiconductor layer 154 between the source electrode 173 and the drain electrode 175.

A protective film 180 is on the source electrode 173 and the drain electrode 175.

A color filter 230 is on the protective film 180, and may inherently represent one of primary colors. As an example of the primary colors, three primary colors such as red, green and blue, or yellow, cyan, magenta, or the like may be included.

An organic insulating film 190 is on the color filter 230. The organic insulating film 190 may planarize one surface of the color filter 230.

The organic insulating film 190 may be formed using the above-described photosensitive resin composition, and includes a cured body of the above-described photosensitive resin composition. Accordingly, further description of the photosensitive resin composition will not be repeated here.

The protective film 180 and the organic insulating film 190 have a contact hole 185 superimposed on the drain electrode 175, and the drain electrode 175 and a pixel electrode 191 may be electrically and physically coupled to each other through the contact hole 185.

An upper panel 200 includes a second substrate 210 facing the first substrate 110. A light blocking member 220 is on a portion between the second substrate 210 and a liquid crystal layer 3. The light blocking member 220 is also called a black matrix and may block light leakage.

In the present specification, a configuration in which the light blocking member 220 is in the upper panel 200 has been described, but the present disclosure is not limited thereto, and the light blocking member 220 may be in a lower panel 100.

An overcoat 250 is between the light blocking member 220 and the liquid crystal layer 3. The overcoat 250 may be formed of an organic insulating material. The overcoat 250 prevents or reduces exposure of the light blocking member 220 and provides a planarized surface. According to an exemplary embodiment, the overcoat 250 may be omitted.

A common electrode 270 may be between the overcoat 250 and the liquid crystal layer 3. The common electrode 270 may include the same or substantially the same material as the pixel electrode 191. The common electrode 270 may be formed in a planar surface form and common voltage is applied thereto.

In some embodiments, an alignment layer may be between the pixel electrode 191 and the liquid crystal layer 3 and between the common electrode 270 and the liquid crystal layer 3.

The liquid crystal layer 3 is between the lower panel 100 and the upper panel 200. The liquid crystal layer 3 has negative dielectric anisotropy, and a liquid crystal molecule 31 of the liquid crystal layer 3 has a major axis being perpendicular (e.g., substantially perpendicular) to the surface of two display panels 100 and 200 in the absence of an electric field.

The organic insulating film 190 including the photosensitive resin composition according to an exemplary embodiment has excellent planarization degree and transmittance, and particularly excellent sensitivity, and has excellent adhesion, contrast ratio, and chemical resistance at high tem-perature and high humidity. The display device including the organic insulating film may also have improved reliability.

In the present specification, the display device using the photosensitive resin composition has been described, but the present disclosure is not limited thereto, and the photosensitive resin composition may be applied to various components used in the organic light emitting device, such as an interlayer insulating film, a column spacer, a partition, or the like.

Hereinafter, exemplary examples are presented for helping in understanding the subject matter of the present disclosure, however, the following Examples only illustrate embodiments of the present disclosure and the scope of the present disclosure is not limited to the following.

EXAMPLES

Synthesis Example 1 (Preparation of Acryl-Based Copolymer (A))

To a flask equipped with a cooler and a stirrer, a mixed solution of 400 parts by weight of tetrahydrofuran, 30 parts by weight of an unsaturated compound represented by the following Chemical Formula 1A, 20 parts by weight of methacrylic acid, 20 parts by weight of styrene, and 30 parts by weight of glycidyl methacrylate was added. The liquid composition was suitably mixed therewith at 600 rpm in the mixing container, and then 15 parts by weight of 2,2'-azobis (2,4-dimethylvaleronitrile) was added thereto. The polymerization mixed solution was slowly heated up to 55° (° C.), maintained at this temperature for 24 hours, and cooled to room temperature (e.g., about 25° C.), and 500 ppm of hydrobezophenone as a polymerization inhibitor was added thereto, thereby obtaining a polymer solution having a solid content concentration of 25 wt %. In order to remove unreacted monomers from the polymer solution, 1000 parts by weight of n-hexane was used to precipitate 100 parts by weight of the polymer solution. After precipitation, a filtration process using a mesh was performed to remove a poor solvent in which the unreacted materials are dissolved. In order to remove the solvent containing the unreacted monomers remaining even after the filtration process, vacuum-drying was performed at 30° (° C.) or less to substantially completely remove the solvent to prepare an acryl-based copolymer. The acryl-based copolymer had a weight average molecular weight of 6,000. Here, the weight average molecular weight is a weight average molecular weight in terms of polystyrene measured by gel permeation chromatography (GPC).

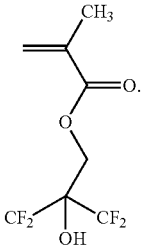

Chemical Formula 1A

Synthesis Example 2 (Preparation of Acryl-Based Copolymer (B))

The acryl-based copolymer (B) was prepared in substantially the same manner as in Synthesis Example 1, except that to the flask equipped with a cooler and a stirrer of Synthesis Example 1, 400 parts by weight of tetrahydrofuran, 30 parts by weight of the unsaturated compound represented by the following Chemical Formula 2A, 20 parts by weight of methacrylic acid, 20 parts by weight of styrene, and 30 parts by weight of glycidyl methacrylate were added. The acryl-based copolymer had a weight average molecular weight of 5,000. Here, the weight average molecular weight is a weight average molecular weight in terms of polystyrene measured by GPC.

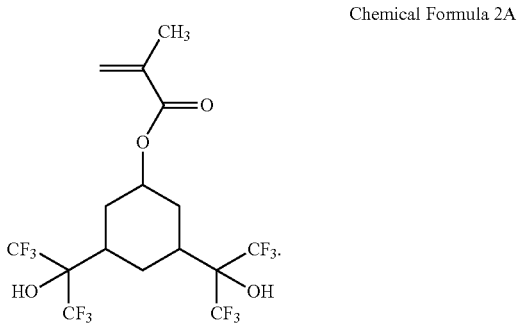 [SMILES: C=C(C)C(=O)OC1CC(C(O)(C(F)(F)F)C(F)(F)F)CC(C(O)(C(F)(F)F)C(F)(F)F)C1]

Chemical Formula 2A

Synthesis Example 3 (Preparation of Acryl-Based Copolymer (C))

The acryl-based copolymer (C) was prepared in substantially the same manner as in Synthesis Example 1, except that to the flask equipped with a cooler and a stirrer of Synthesis Example 1, 400 parts by weight of tetrahydrofuran, 30 parts by weight of the unsaturated compound represented by the following Chemical Formula 3A, 20 parts by weight of methacrylic acid, 20 parts by weight of styrene, and 30 parts by weight of glycidyl methacrylate were added. The acryl-based copolymer had a weight average molecular weight of 5,500. Here, the weight average molecular weight is a weight average molecular weight in terms of polystyrene measured by GPC.

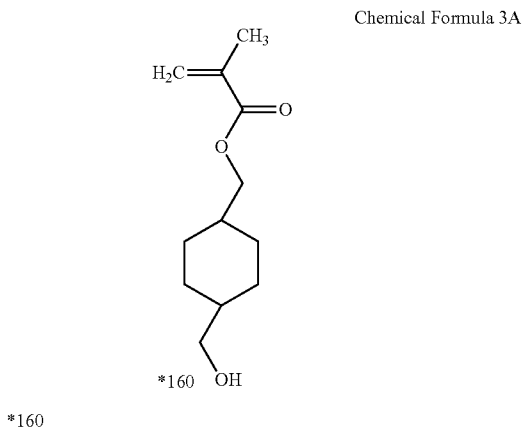

Chemical Formula 3A

*160

Synthesis Example 4 (Preparation of Acryl-Based Copolymer (D))

The acryl-based copolymer (D) was prepared in substantially the same manner as in Synthesis Example 1, except that to the flask equipped with a cooler and a stirrer of Synthesis Example 1, 400 parts by weight of tetrahydrofuran, 30 parts by weight of the unsaturated compound represented by the following Chemical Formula 4A, 20 parts by weight of methacrylic acid, 20 parts by weight of styrene, and 30 parts by weight of glycidyl methacrylate were added. The acryl-based copolymer had a weight average molecular weight of 6,000. Here, the weight average molecular weight is a weight average molecular weight in terms of polystyrene measured by GPC.

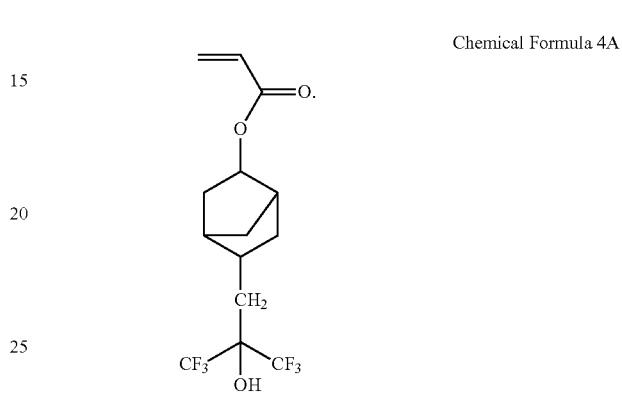

Chemical Formula 4A

Synthesis Example 5 (Preparation of Acryl-Based Copolymer (E))

The acryl-based copolymer (E) was prepared in substantially the same manner as in Synthesis Example 1, except that to the flask equipped with a cooler and a stirrer of Synthesis Example 1, 400 parts by weight of tetrahydrofuran, 30 parts by weight of the unsaturated compound represented by the following Chemical Formula 5A, 20 parts by weight of methacrylic acid, 20 parts by weight of styrene, and 30 parts by weight of glycidyl methacrylate were added. The acryl-based copolymer had a weight average molecular weight of 6,000. Here, the weight average molecular weight is a weight average molecular weight in terms of polystyrene measured by GPC.

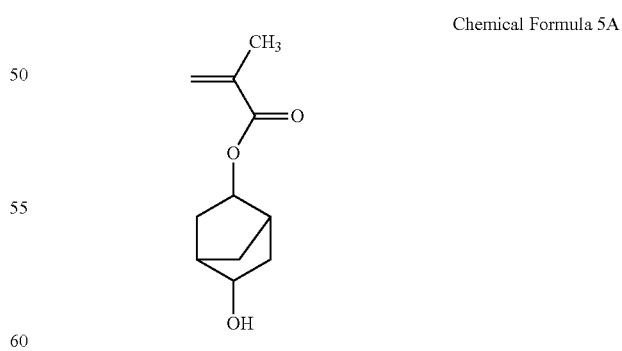

Chemical Formula 5A

Synthesis Example 6 (Preparation of Acryl-Based Copolymer (F))

The acryl-based copolymer (F) was prepared in substantially the same manner as in Synthesis Example 1, except that to the flask equipped with a cooler and a stirrer of Synthesis Example 1, 400 parts by weight of tetrahydrofuran, 30 parts by weight of the unsaturated compound represented by the following Chemical Formula 6A, 20 parts by weight of methacrylic acid, 20 parts by weight of styrene, and 30 parts by weight of glycidyl methacrylate were added. The acryl-based copolymer had a weight average molecular weight of 6,000. Here, the weight average molecular weight is a weight average molecular weight in terms of polystyrene measured by GPC.

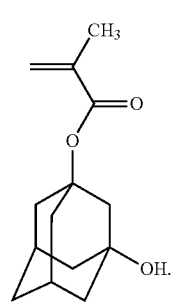

Chemical Formula 6A

Synthesis Example 7 (Preparation of Acryl-Based Copolymer (G))

The acryl-based copolymer (G) was prepared in substantially the same manner as in Synthesis Example 1, except that to the flask equipped with a cooler and a stirrer of Synthesis Example 1, 400 parts by weight of tetrahydrofuran, 30 parts by weight of the unsaturated compound represented by the following Chemical Formula 7A, 20 parts by weight of methacrylic acid, 20 parts by weight of styrene, and 30 parts by weight of glycidyl methacrylate were added. The acryl-based copolymer had a weight average molecular weight of 6,000. Here, the weight average molecular weight is a weight average molecular weight in terms of polystyrene measured by GPC.

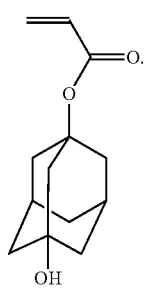

Chemical Formula 7A

Synthesis Example 8 (Preparation of Acryl-Based Copolymer (H))

The acryl-based copolymer (H) was prepared in substantially the same manner as in Synthesis Example 1, except that to the flask equipped with a cooler and a stirrer of Synthesis Example 1, 400 parts by weight of tetrahydrofuran, 30 parts by weight of the unsaturated compound represented by the following Chemical Formula 8A, 20 parts by weight of methacrylic acid, 20 parts by weight of styrene, and 30 parts by weight of glycidyl methacrylate were added. The acryl-based copolymer had a weight average molecular weight of 6,000. Here, the weight average molecular weight is a weight average molecular weight in terms of polystyrene measured by GPC.

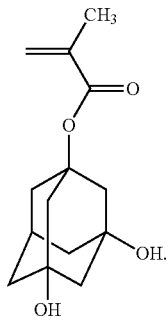

Chemical Formula 8A

Synthesis Example 9 (Preparation of 1,2-Quinonediazide Compound)

1 mol of a phenol compound represented by the following Chemical Formula A-a and 2.0 mol of 1,2-naphthoquinone-diazide-5-sulfonic acid [chloride] were subjected to a condensation reaction to prepare a 1,2-naphthoquinonediazide-5-sulfonic ester compound.

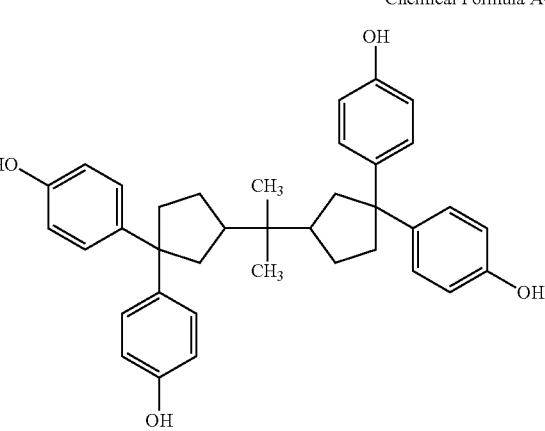

Chemical Formula A-a

Synthesis Example 10 (Preparation of 1,2-Quinonediazide Compound)

1 mol of a phenol compound represented by the following Chemical Formula B-a and 2.0 mol of 1,2-naphthoquinone-diazide-5-sulfonic acid [chloride] were subjected to a condensation reaction to prepare a 1,2-naphthoquinonediazide-5-sulfonic ester compound.

[Chemical Formula B-a]

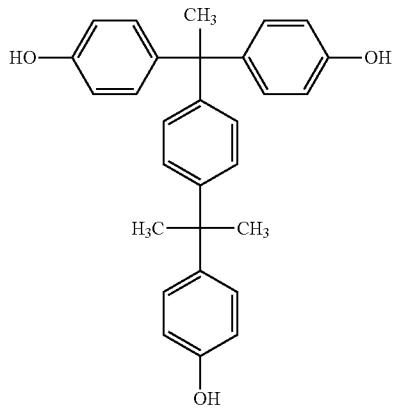

Comparative Synthesis Example 1 (Preparation of Acryl-Based Copolymer (I))

The acryl-based copolymer (I) was prepared in substantially the same manner as in Synthesis Example 1, except that to the flask equipped with a cooler and a stirrer of Synthesis Example 1, 400 parts by weight of tetrahydrofuran, 30 parts by weight of hydroxyethyl methacrylate, 20 parts by weight of methacrylic acid, 20 parts by weight of styrene, and 30 parts by weight of glycidyl methacrylate were added. The acryl-based copolymer had a weight average molecular weight of 6,000. Here, the weight average molecular weight is a weight average molecular weight in terms of polystyrene measured by GPC.

Comparative Synthesis Example 2 (Preparation of Acryl-Based Copolymer (J))

The acryl-based copolymer (J) was prepared in substantially the same manner as in Synthesis Example 1, except that to the flask equipped with a cooler and a stirrer of Synthesis Example 1, 400 parts by weight of tetrahydrofuran, 30 parts by weight of hydroxybutyl methacrylate, 20 parts by weight of methacrylic acid, 20 parts by weight of styrene, and 30 parts by weight of glycidyl methacrylate were added. The acryl-based copolymer had a weight average molecular weight of 6,000. Here, the weight average molecular weight is a weight average molecular weight in terms of polystyrene measured by GPC.

Comparative Synthesis Example 3 (Preparation of Acryl-Based Copolymer (K))

The acryl-based copolymer (K) was prepared in substantially the same manner as in Synthesis Example 1, except that to the flask equipped with a cooler and a stirrer of Synthesis Example 1, 400 parts by weight of tetrahydrofuran, 30 parts by weight of methyl methacrylate, 20 parts by weight of methacrylic acid, 20 parts by weight of styrene, and 30 parts by weight of glycidyl methacrylate were added. The acryl-based copolymer had a weight average molecular weight of 6,000. Here, the weight average molecular weight is a weight average molecular weight in terms of polystyrene measured by GPC.

Example 1 (Preparation of Photosensitive Resin Composition)

30 parts by weight of the 1,2-naphthoquinonediazide-5-sulfonic ester compound prepared in Synthesis Example 9 and 3 parts by weight of (3-glycidoxypropyl)trimethoxysilane as a silane coupling agent, based on 100 parts by weight of the acryl-based copolymer prepared in Synthesis Example 1 were dissolved in propylene glycol monomethyl ether acetate so that the solid content of the mixture is 20 wt %, based on 100 wt % of the solid content of the resultant composition, and then the solution was filtered with a Millipore filter of 0.1 µm, thereby preparing a photosensitive resin composition.

Example 2 (Preparation of Photosensitive Resin Composition)

A photosensitive resin composition was prepared in substantially the same manner as in Example 1, except that the acryl-based copolymer (B) of Synthesis Example 2 was used instead of the acryl-based copolymer (A) of Synthesis Example 1, in Example 1.

Example 3 (Preparation of Photosensitive Resin Composition)

A photosensitive resin composition was prepared in substantially the same manner as in Example 1, except that the acryl-based copolymer (C) of Synthesis Example 3 was used instead of the acryl-based copolymer (A) of Synthesis Example 1, in Example 1.

Example 4 (Preparation of Photosensitive Resin Composition)

A photosensitive resin composition was prepared in substantially the same manner as in Example 1, except that the acryl-based copolymer (D) of Synthesis Example 4 was used instead of the acryl-based copolymer (A) of Synthesis Example 1, in Example 1.

Example 5 (Preparation of Photosensitive Resin Composition)

A photosensitive resin composition was prepared in substantially the same manner as in Example 1, except that the acryl-based copolymer (E) of Synthesis Example 5 was used instead of the acryl-based copolymer (A) of Synthesis Example 1, in Example 1.

Example 6 (Preparation of Photosensitive Resin Composition)

A photosensitive resin composition was prepared in substantially the same manner as in Example 1, except that the acryl-based copolymer (F) of Synthesis Example 6 was used instead of the acryl-based copolymer (A) of Synthesis Example 1, in Example 1.

Example 7 (Preparation of Photosensitive Resin Composition)

A photosensitive resin composition was prepared in substantially the same manner as in Example 1, except that the acryl-based copolymer (G) of Synthesis Example 7 was used instead of the acryl-based copolymer (A) of Synthesis Example 1, in Example 1.

Example 8 (Preparation of Photosensitive Resin Composition)

A photosensitive resin composition was prepared in substantially the same manner as in Example 1, except that the acryl-based copolymer (H) of Synthesis Example 8 was used instead of the acryl-based copolymer (A) of Synthesis Example 1, in Example 1.

Example 9 (Preparation of Photosensitive Resin Composition)

A photosensitive resin composition was prepared in substantially the same manner as in Example 1, except that 15 parts by weight of 1,2-naphthoquinonediazide-5-sulfonic ester compound (A-a) Synthesis Example 9 and 15 parts by weight of the 1,2-naphthoquinonediazide-5-sulfonic ester compound (B-a) of Synthesis Example 10 were used instead of 30 parts by weight of the 1,2-naphthoquinonediazide-5-sulfonic ester compound (A-a) of Synthesis Example 9, in Example 1.

Example 10 (Preparation of Photosensitive Resin Composition)

A photosensitive resin composition was prepared in substantially the same manner as in Example 1, except that (3-isocyanatopropyl)trimethoxysilane was used instead of (3-glycidoxypropyl)trimethoxysilane as a silane coupling agent, in Example 1.

Comparative Example 1 (Preparation of Photosensitive Resin Composition)

A photosensitive resin composition was prepared in substantially the same manner as in Example 1, except that the acryl-based copolymer (I) of Comparative Synthesis Example 1 was used instead of the acryl-based copolymer (A) of Synthesis Example 1, in Example 1.

Comparative Example 2 (Preparation of Photosensitive Resin Composition)

A photosensitive resin composition was prepared in substantially the same manner as in Example 1, except that the acryl-based copolymer (J) of Comparative Synthesis Example 2 was used instead of the acryl-based copolymer (A) of Synthesis Example 1, in Example 1.

Comparative Example 3 (Preparation of Photosensitive Resin Composition)

A photosensitive resin composition was prepared in substantially the same manner as in Example 1, except that the acryl-based copolymer (K) of Comparative Synthesis Example 3 was used instead of the acryl-based copolymer (A) of Synthesis Example 1, in Example 1.

Comparative Example 4 (Preparation of Photosensitive Resin Composition)

A photosensitive resin composition was prepared in substantially the same manner as in Example 1, except that (3-glycidoxypropyl)trimethoxysilane as a silane coupling agent was not used, in Example 1.

For Examples 1 to 10 and Comparative Examples 1 to 4, physical properties such as sensitivity, resolution, curing process margin, transmittance, heat resistant discoloration, adhesion, and heat resistance were measured, and are shown in the following Table 1. The photosensitive resin compositions according to Examples 1 to 10 and Comparative Example 1 to 4 were coated on a glass substrate using a spin coater, and free baked on a hot plate at 100° (° C.) for 2 minutes, thereby forming a film having a thickness of 4.0 μm.

A) Sensitivity—Ultraviolet rays at an intensity at broadband of 20 mW/cm$^2$ were irradiated at a sensitivity of a 10 μm contact hole CD reference amount on the thus-formed film using a set or predetermined pattern mask, then development was performed with 2.38 wt % of an aqueous tetramethylammonium hydroxide solution at 23° C. for 1 minute, and washing was performed with ultrapure water for 1 minute. Then, 400 mJ/cm$^2$ of ultraviolet rays having an intensity of 20 mW/cm$^2$ at 365 nm were irradiated on the developed pattern, and curing was performed in an oven at 230° C. for 30 minutes, thereby obtaining a pattern film having a thickness of 3.0 μm.

B) Resolution—a minimum size of a 10 μm contact hole pattern formed at the time of measuring sensitivity in A) was measured.

C) Curing process margin—a pattern film was formed in substantially the same manner as in the measurement of sensitivity in A), except that a rate of CD change before and after curing was measured based on a 10 μm contact hole CD. Here, a rate of change of 0-10% was indicated as ○, a rate of change of 10-20% was indicated as Δ, and a rate of change more than 20% was indicated as X.

D) Transmittance—transmittance was evaluated by measuring a transmittance ratio at 400 nm of a pattern film formed at the time of measuring sensitivity in A) using a spectrophotometer. Here, the transmittance of 90% or more was indicated as ○, the transmittance of 85-90% was indicated as Δ, and the transmittance less than 80% was indicated as X.

E) Heat resistant discoloration—curing was further performed on the substrate measured at the time of evaluating transmittance in D) in an oven at 230° (° C.) twice for 30 minutes, thereby evaluating heat resistant discoloration by 400 nm transmittance ratio change of the pattern film before and after curing. Here, the rate of change less than 3% was indicated as ○, the rate of change of 3-5% was indicated as Δ, and the rate of change more than 5% was indicated as X.

F) Adhesion—adhesion was evaluated by observing the pattern film formed at the time of measuring sensitivity in A) through a scope as to whether the pattern was lost or not. The case that adhesion was secured at a free bake temperature of 95° (° C.) or more was indicated as ○, the case that adhesion was secured at a free bake temperature of 100-105° (° C.) was indicated as Δ, and the case that adhesion was secured at a free bake temperature more than 105° (° C.), or the pattern was lost was indicated as X.

G) Heat resistance—heat resistance was measured using thermogravimetric analysis (TGA). The pattern formed at the time of measuring sensitivity in A) was sampled, and the temperature was raised from room temperature (e.g., about 25° C.) up to 900° (° C.) at 10° (° C.)/min using TGA. The case of 5 wt % loss temperature more than 300° (° C.) was indicated as ○, the case of 5 wt % loss temperature of 280-300° (° C.) was indicated as Δ, and the case of 5 wt % loss temperature less than 280° (° C.) was indicated as X.

TABLE 1

| Classification | Sensitivity (mJ/cm$^2$) | Resolution (μm) | Curing process margin | Transmittance | Heat resistant discoloration | Adhesion | Heat resistance | Profile length (KPI) |
|---|---|---|---|---|---|---|---|---|
| Example 1 | 85 | 3 | ○ | ○ | ○ | ○ | ○ | 14 ± 2 μm |
| Example 2 | 80 | 3 | ○ | ○ | ○ | ○ | ○ | 14 ± 2 μm |
| Example 3 | 90 | 3 | ○ | ○ | ○ | ○ | ○ | 14 ± 2 μm |
| Example 4 | 88 | 3 | ○ | ○ | ○ | ○ | ○ | 14 ± 2 μm |
| Example 5 | 82 | 3 | ○ | ○ | ○ | ○ | ○ | 14 ± 2 μm |
| Example 6 | 85 | 3 | ○ | ○ | ○ | ○ | ○ | 14 ± 2 μm |
| Example 7 | 85 | 3 | ○ | ○ | ○ | ○ | ○ | 14 ± 2 μm |
| Example 8 | 84 | 3 | ○ | ○ | ○ | ○ | ○ | 14 ± 2 μm |
| Example 9 | 87 | 3 | ○ | ○ | ○ | ○ | ○ | 14 ± 2 μm |
| Example 10 | 83 | 3 | ○ | ○ | ○ | ○ | ○ | 14 ± 2 μm |
| Comparative Example 1 | 125 | 3 | ○ | ○ | ○ | ○ | ○ | 17 ± 3 μm |
| Comparative Example 2 | 120 | 3 | ○ | ○ | ○ | ○ | ○ | 17 ± 3 μm |
| Comparative Example 3 | 130 | 3 | ○ | ○ | ○ | X | ○ | 17 ± 3 μm |
| Comparative Example 4 | 88 | 3 | ○ | ○ | ○ | X | ○ | 17 ± 3 μm |

As shown in the above Table 1, the photosensitive resin compositions prepared in Examples 1 to 10 had excellent performance such as resolution, curing process margin, transmittance, heat resistant discoloration, and heat resistance. For example, it was confirmed that the photosensitive resin compositions prepared in Examples 1 to 10 had excellent sensitivity as compared with Comparative Examples 1 to 3, thereby reducing the time required for the process, and had excellent adhesion as compared with Comparative Example 4 to secure excellent panel reliability. In addition, as shown in Table 1, it was confirmed that the profile lengths according to the Examples were 12 μm at the minimum to 16 μm, and the profile lengths according to the Comparative Examples were 14 μm at the minimum to 20 μm. In the case according to the example embodiments of the present application, it was confirmed that light exposure sensitivity was excellent to have a relatively short profile. In addition, in the case of having excellent light exposure sensitivity, a light exposure amount required or used for the process is decreased, thereby increasing productivity.

Though exemplary embodiments of the present disclosure have been described above, the scope of the present disclosure is not limited thereto, and many variations and modifications by a person skilled in the art using the basic concept of the present disclosure as defined in the following claims, an equivalents thereof, also belong within the scope of the present disclosure.

While the subject matter of the present disclosure has been described in connection with what is presently considered to be practical exemplary embodiments, it is to be understood that the present disclosure is not limited to the disclosed embodiments. On the contrary, it is intended to cover various modifications and equivalent arrangements included within the spirit and scope of the appended claims, and equivalents thereof.

What is claimed is:

1. A photosensitive resin composition comprising:
   a) an acryl-based copolymer obtained by copolymerizing:
   i) a hydroxyl group-containing unsaturated compound;
   ii) an unsaturated carboxylic acid, an unsaturated carboxylic anhydride, or a mixture thereof;
   iii) an epoxy group-containing unsaturated compound; and
   iv) an olefin-based unsaturated compound,
   b) a 1,2-quinonediazide 5-sulfonic ester compound having a phenol compound comprising a phenol compound represented by the following Chemical Formula A as ballast,
   c) a silane coupling agent, and
   d) a solvent:

Chemical Formula A

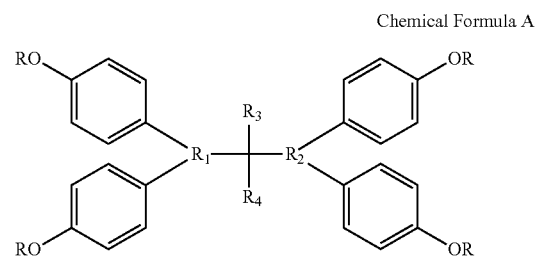

wherein $R_1$ and $R_2$ are cyclopropane, cyclobutane, cyclopentane, or an alkyl group having 0 to 4 carbon atoms or an alkoxy group having 0 to 4 carbon atoms, respectively, $R_3$ and $R_4$ are H or $CH_3$, respectively, and R is independently H, $CH_3$ or

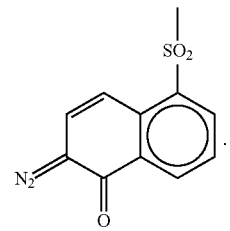

.

2. The photosensitive resin composition of claim 1, wherein:
   the hydroxyl group-containing unsaturated compound comprises at least one selected from compounds represented by the following Chemical Formulae 1 to 8:

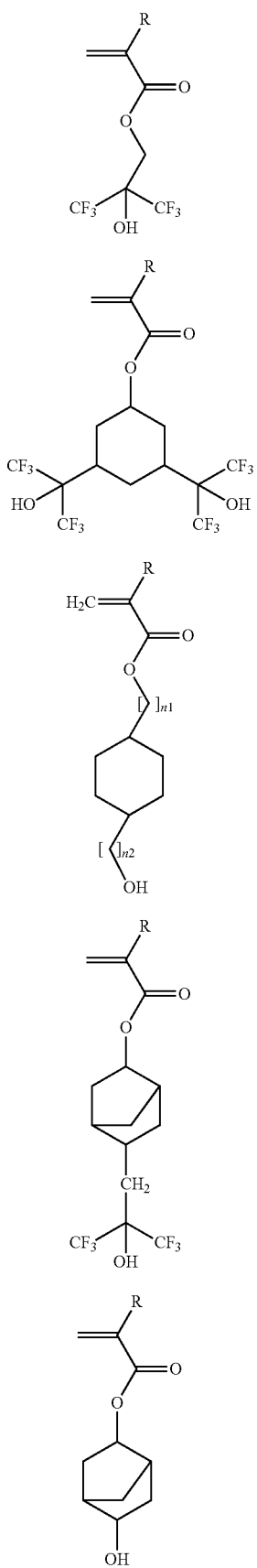

Chemical Formula 1

Chemical Formula 2

Chemical Formula 3

Chemical Formula 4

Chemical Formula 5

Chemical Formula 6

Chemical Formula 7

Chemical Formula 8 wherein R is independently H or $CH_3$, and $n_1$ and $n_2$ are an integer of 0 to 4, respectively.

3. The photosensitive resin composition of claim 1, further comprising:

a compound represented by the following Chemical Formula B:

Chemical Formula B wherein R is H, $CH_3$ or

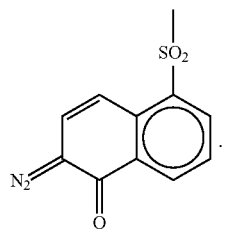

4. The photosensitive resin composition of claim 3, wherein:
  a) 100 parts by weight of the acryl-based copolymer obtained by copolymerizing:
    i) 5 to 70 parts by weight of the hydroxyl group-containing unsaturated compound;
    ii) 5 to 40 parts by weight of the unsaturated carboxylic acid, the unsaturated carboxylic anhydride, or the mixture thereof;
    iii) 10 to 70 parts by weight of the epoxy group-containing unsaturated compound; and
    iv) 5 to 70 parts by weight of the olefin-based unsaturated compound,
  b) 5 to 50 parts by weight of the 1,2-quinonediazide 5-sulfonic ester compound having the phenol compound comprising the compound represented by Chemical Formula A as ballast, or a 1,2-quinonediazide 5-sulfonic ester compound having a phenol compound comprising the compound represented by Chemical Formula A and the compound represented by Chemical Formula B as ballast, and
  c) 0.1 to 30 parts by weight of the silane coupling agent.

5. The photosensitive resin composition of claim 4, wherein:
  the solvent is present in an amount such that a solid content including a), b) and c) is 10 to 50 wt %.

6. The photosensitive resin composition of claim 1, further comprising:
  at least one selected from compounds represented by the following Chemical Formulae B-1, B-2, B-3, B-4, and B-5:

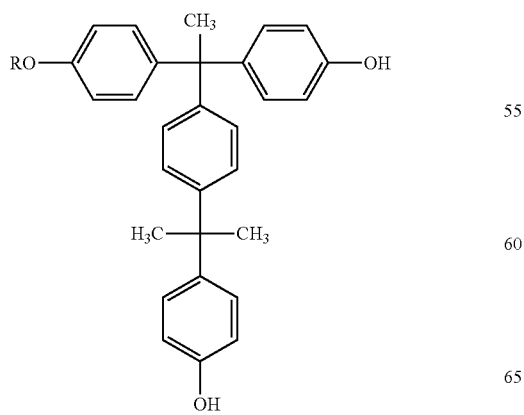

Chemical Formula B-1

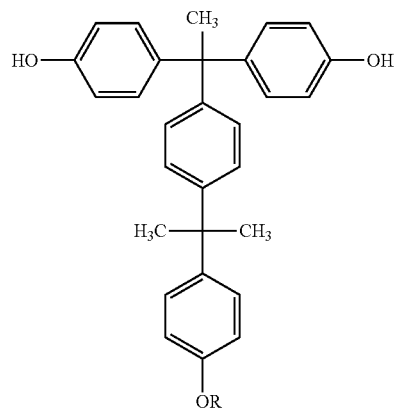

Chemical Formula B-2

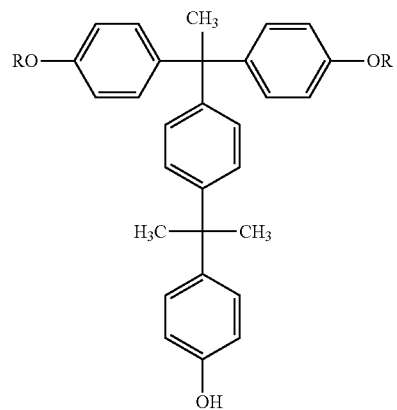

Chemical Formula B-3

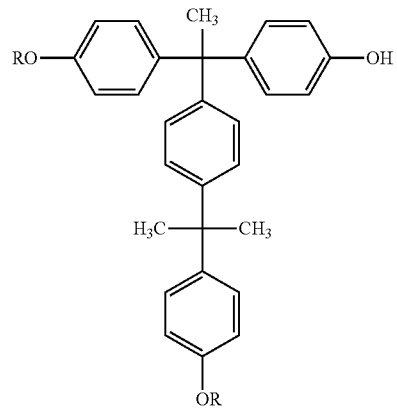

Chemical Formula B-4

Chemical Formula B-5
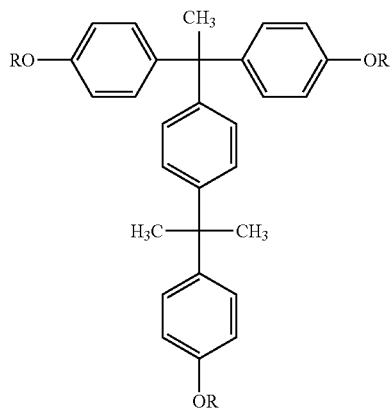
wherein R is
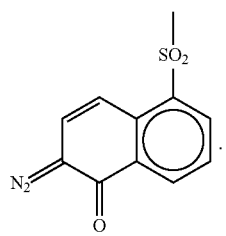
7. The photosensitive resin composition of claim 1, wherein:
the compound represented by Chemical Formula A includes at least one selected from compounds represented by the following Chemical Formulae A-1, A-2, A-3, A-4, A-5 and A-6:
Chemical Formula A-1
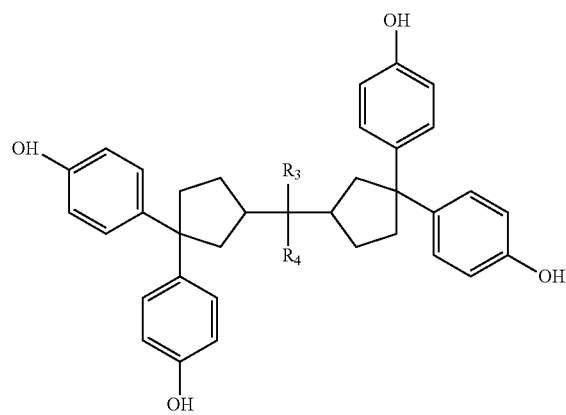
Chemical Formula A-2
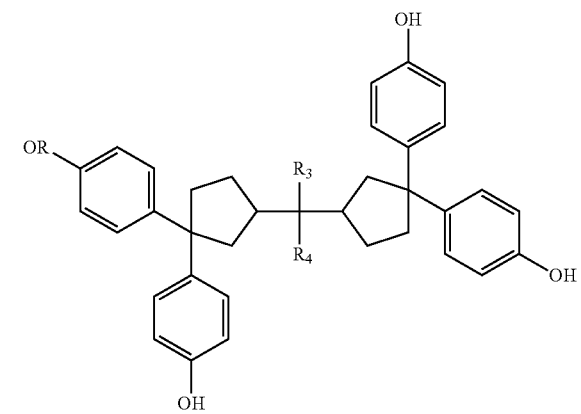
Chemical Formula A-3
Chemical Formula A-4
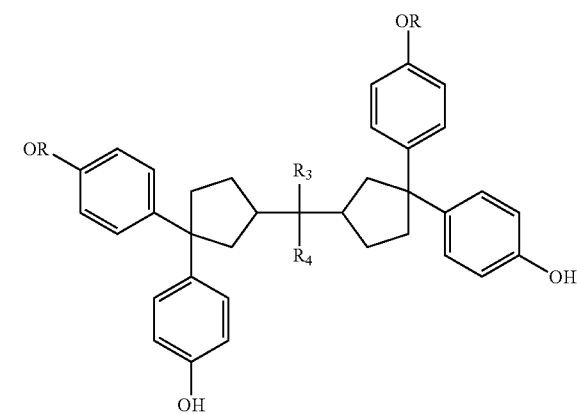

-continued

Chemical Formula A-5

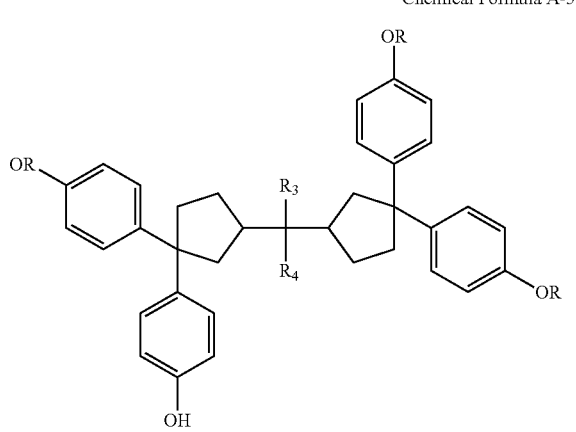

Chemical Formula A-6

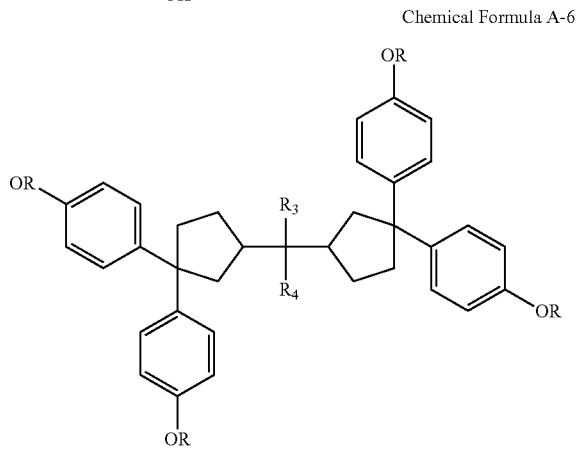

wherein $R_3$ and $R_4$ are H or $CH_3$, respectively, and R is

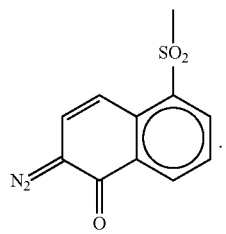

8. The photosensitive resin composition of claim 1, wherein:
the unsaturated carboxylic acid, the unsaturated carboxylic anhydride or the mixture thereof of a)ii) comprises one or more selected from the group consisting of an acrylic acid, a methacrylic acid, a maleic acid, a fumaric acid, a citraconic acid, a metaconic acid, an itaconic acid and an unsaturated dicarboxylic anhydride thereof.

9. The photosensitive resin composition of claim 1, wherein:
the epoxy group-containing unsaturated compound of a)iii) comprises one or more selected from the group consisting of glycidyl acrylate, glycidyl methacrylate, glycidyl α-ethyl acrylate, glycidyl α-n-propyl acrylate, glycidyl α-n-butyl acrylate, β-methylglycidyl acrylate, β-methylglycidyl methacrylate, β-ethylglycidyl acrylate, β-ethylglycidyl methacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethyl acrylate, o-vinylbenzylglycidyl ether, m-vinylbenzylglycidyl ether and p-vinylbenzylglycidyl ether, 3,4-epoxycyclohexyl methacrylate, 3,4-epoxycyclohexylmethyl methacrylate, 3,4-epoxycyclohexyl acrylate, and 3,4-epoxycyclohexylmethyl acrylate.

10. The photosensitive resin composition of claim 1, wherein:
the olefin-based unsaturated compound of a)iv) comprises one or more selected from the group consisting of methyl methacrylate, ethyl methacrylate, n-butyl methacrylate, sec-butyl methacrylate, tert-butyl methacrylate, methyl acrylate, isopropyl acrylate, cyclohexyl methacrylate, 2-methylcyclohexyl methacrylate, dicyclopentenyl acrylate, dicyclopentanyl acrylate, dicyclopentenyl methacrylate, dicyclopentanyl methacrylate, 1-adamantyl acrylate, 1-adamantyl methacrylate, dicyclopentanyloxyethyl methacrylate, isoboronyl methacrylate, cyclohexyl acrylate, 2-methylcyclohexyl acrylate, dicyclopentanyloxyethyl acrylate, isoboronyl acrylate, phenyl methacrylate, phenyl acrylate, benzyl acrylate, 2-hydroxyethyl methacrylate, styrene, σ-methylstyrene, m-methylstyrene, p-methylstyrene, vinyltoluene, p-methoxystyrene, 1,3-butadiene, isoprene, and 2,3-dimethyl 1,3-butadiene.

11. The photosensitive resin composition of claim 1, wherein:
the acryl-based copolymer of a) has a weight average molecular weight (Mw) in terms of polystyrene of 3,000 to 20,000.

12. The photosensitive resin composition of claim 1, wherein:
the silane coupling agent of c) comprises one or more selected from the group consisting of (3-glycidoxypropyl)trimethoxysilane, (3-glycidoxypropyl)triethoxysilane, (3-glycidoxypropyl)methyldimethoxysilane, (3-glycidoxypropyl)methyldiethoxysilane, (3-glycidoxypropyl)dimethylethoxysilane, 3,4-epoxybutyltrimethoxysilane, 3,4-epoxybutyltriethoxysilane, 2-(3,4-epoxycyclohexyl)ethyltrimethoxysilane, 2-(3,4-epoxycyclohexyl)ethyltriethoxysilane, aminopropyltrimethoxysilane, aminopropyltriethoxysilane, 3-triethoxysilyl-N-(1,3-dimethyl-butylidene)propylamine, N-(2-aminoethyl)-3-aminopropyltrimethoxysilane, N-(2-aminoethyl)-3-aminopropyltriethoxysilane, N-(2-aminoethyl)-3-aminopropyl methyldimethoxysilane, N-phenyl-3-aminopropyltrimethoxysilane, and (3-isocyanatopropyl)triethoxysilane.

13. The photosensitive resin composition of claim 1, wherein:
the solvent of d) comprises one or more selected from the group consisting of diethylene glycol dimethyl ether, diethylene glycol methylethyl ether, propylene glycol methyl ether acetate, propylene glycol ethyl ether acetate, propylene glycol propyl ether acetate, propylene glycol methyl ether propionate, propylene glycol ethyl ether propionate, propylene glycol propyl ether propionate, propylene glycol methyl ether, propylene glycol ethyl ether, propylene glycol propyl ether, propylene glycol butyl ether, dipropylene glycol dimethyl ether, dipropylene glycol diethyl ether, butylene glycol monomethyl ether, butylene glycol monoethyl ether, dibutylene glycol dimethyl ether, dibutylene glycol diethyl ether, diethylene glycol butylmethyl ether, diethylene glycol butylethyl ether, triethylene glycol dimethyl ether, triethylene glycol butylmethyl ether, diethylene glycol tert-butyl ether, tetraethylene glycol dimethyl ether, diethylene glycol ethylhexyl ether, diethylene glycol methylhexyl ether, dipropylene glycol butylmethyl ether, dipropylene glycol ethylhexyl ether, and dipropylene glycol methylhexyl ether.

14. A display device comprising a cured body of the photosensitive resin composition of claim 1.

15. The display device of claim 14, comprising:
an organic insulating film comprising the cured body of the photosensitive resin composition.

16. The display device of claim 14, further comprising:
a substrate,
a thin film transistor on the substrate,
a pixel electrode coupled with the thin film transistor, and
a color filter superimposed on the thin film transistor.

17. The display device of claim 16, wherein:
the color filter is between the organic insulating film and the thin film transistor.

18. A display device comprising:
a substrate,
a thin film transistor on the substrate,
a pixel electrode coupled with the thin film transistor, and
an organic insulating film superimposed on the substrate,
wherein the organic insulating film comprising a cured body of a photosensitive resin composition comprising:
an acryl-based copolymer obtained by copolymerizing:
i) a hydroxyl group-containing unsaturated compound;
ii) an unsaturated carboxylic acid, an unsaturated carboxylic anhydride, or a mixture thereof;
iii) an epoxy group-containing unsaturated compound; and
iv) an olefin-based unsaturated compound,
b) a 1,2-quinonediazide 5-sulfonic ester compound having a phenol compound including a compound represented by the following Chemical Formula A as ballast, and
c) a silane coupling agent:

Chemical Formula A

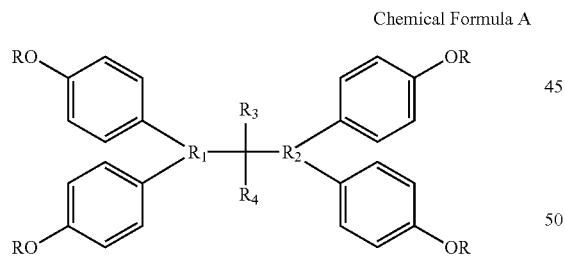

wherein $R_1$ and $R_2$ are cyclopropane, cyclobutane, or cyclopentane, respectively, $R_3$ and $R_4$ are H or $CH_3$, respectively, and R is independently H, $CH_3$ or

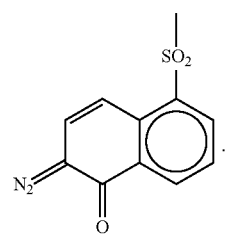

19. A display device of claim 18, wherein:
the hydroxyl group-containing unsaturated compound comprises at least one selected from compounds represented by the following Chemical Formulae 1 to 8:

Chemical Formula 1

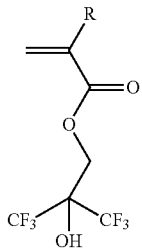

Chemical Formula 2

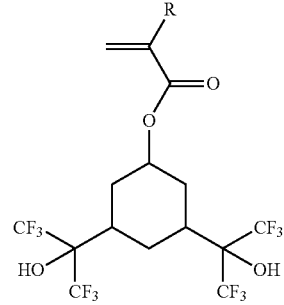

Chemical Formula 3

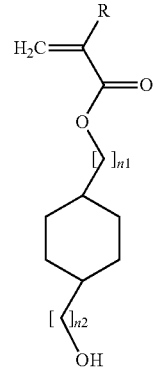

Chemical Formula 4

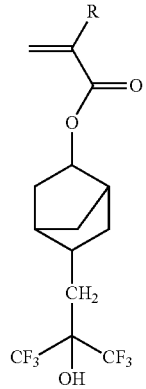

Chemical Formula 5

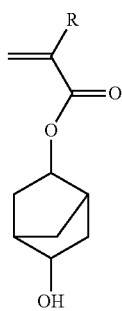

Chemical Formula A-1

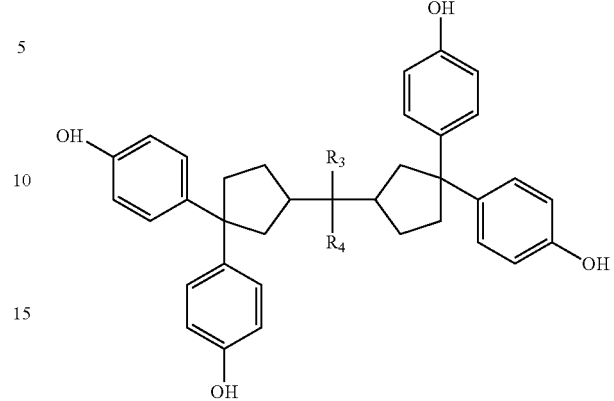

Chemical Formula 6

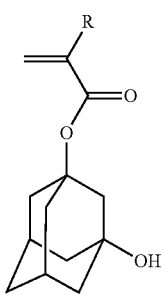

Chemical Formula 7

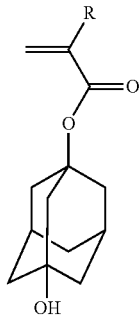

Chemical Formula A-2

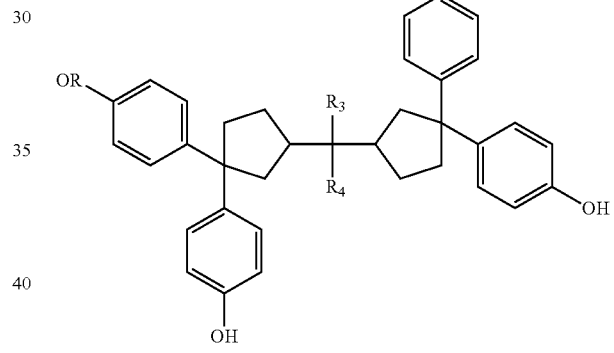

Chemical Formula 8

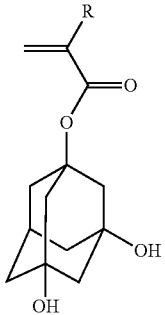

Chemical Formula A-3

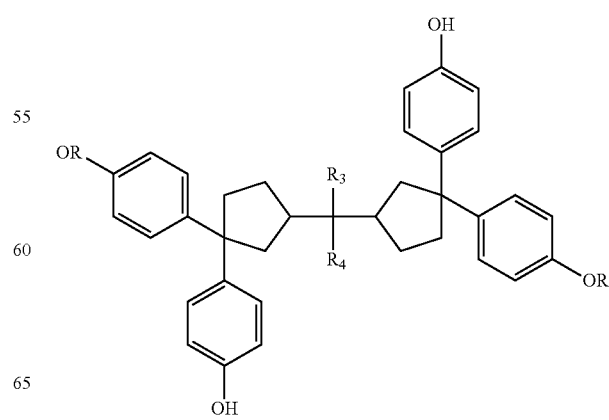

wherein R is H or $CH_3$, and $n_1$ and $n_2$ are an integer of 0 to 4, respectively.

20. The display device of claim 18, wherein:

the compound represented by Chemical Formula A comprises at least one selected from compounds represented by the following Chemical Formulae A-1, A-2, A-3, A-4, A-5, and A-6:

Chemical Formula A-4
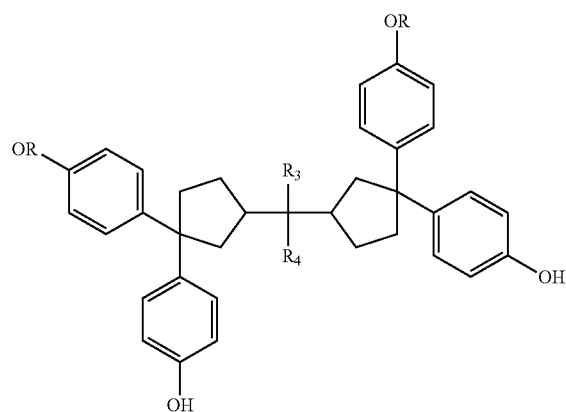
Chemical Formula A-5
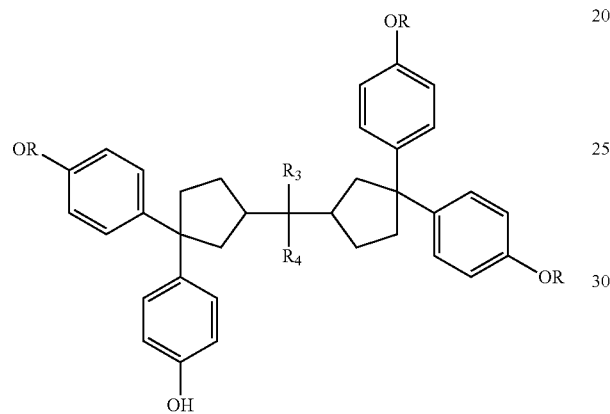
Chemical Formula A-6
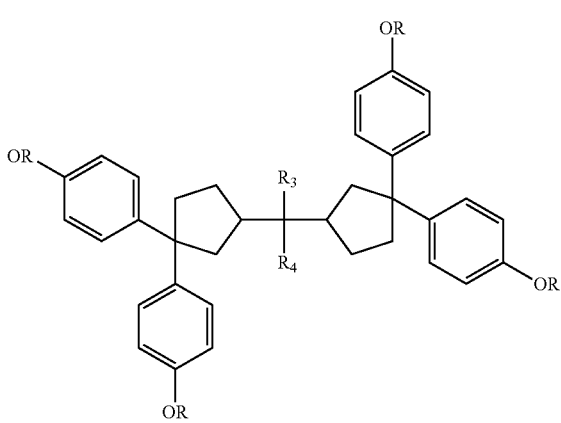
wherein $R_3$ and $R_4$ are H or $CH_3$, respectively, and R is
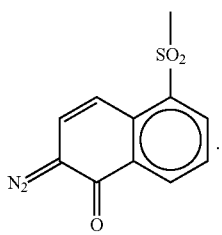
* * * * *